(12) United States Patent
Cooley et al.

(10) Patent No.: US 9,024,478 B2
(45) Date of Patent: May 5, 2015

(54) PHOTOVOLTAIC ENERGY EXTRACTION WITH MULTILEVEL OUTPUT DC-DC SWITCHED CAPACITOR CONVERTERS

(75) Inventors: John J. Cooley, Boston, MA (US); Steven B. Leeb, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1030 days.

(21) Appl. No.: 13/039,382

(22) Filed: Mar. 3, 2011

(65) Prior Publication Data

US 2012/0223583 A1     Sep. 6, 2012

(51) Int. Cl.
| | |
|---|---|
| *H02J 1/00* | (2006.01) |
| *H03K 3/57* | (2006.01) |
| *H02J 3/38* | (2006.01) |
| *H02M 3/07* | (2006.01) |

(52) U.S. Cl.
CPC . *H03K 3/57* (2013.01); *H02J 3/385* (2013.01); *H02M 3/07* (2013.01); *Y02E 10/58* (2013.01)

(58) Field of Classification Search
USPC .......................................................... 307/82
See application file for complete search history.

(56) References Cited

U.S. PATENT DOCUMENTS

| | | | |
|---|---|---|---|
| 7,843,085 B2 | 11/2010 | Ledenev et al. | |
| 2007/0183174 A1 | 8/2007 | Lee | |
| 2008/0143188 A1 | 6/2008 | Adest et al. | |
| 2009/0079385 A1* | 3/2009 | Xiao et al. ..................... | 320/102 |
| 2012/0043823 A1* | 2/2012 | Stratakos et al. ............... | 307/82 |
| 2013/0221753 A1 | 8/2013 | Perreault et al. | |

FOREIGN PATENT DOCUMENTS

| | | |
|---|---|---|
| JP | 2007-058845 A | 3/2007 |
| JP | 2007-089373 A | 4/2007 |

OTHER PUBLICATIONS

Peng, F.Z.; Wei Qian; Dong Cao, "Recent advances in multilevel converter/inverter topologies and applications," Power Electronics Conference (IPEC), 2010 International , vol., No., pp. 492,501, Jun. 21-24, 2010.*
O. Alonso, et al., "Cascaded H-Bridge Multilevel Converter for Grid Connected Photovoltaic Generators with Independent Maximum Power Point Tracking of Each Solar Array," 2003 IEEE 34.sup.th, Annual Power Electronics Specialists Conference, Acapulco, Mexico, Jun. 15-19, 2003, pp. 731-735, vol. 2.*
Christopher Lee Hutchens, "Design and Control of Charge-Pumped Reboost Converter for PV Applications", Virginia Polytechnic Institute and State University, 2010, pp. 6-7.*
International Search Report and Written Opinion dated Sep. 27, 2012 from International Application No. PCT/US2012/026015, 9 pages.

(Continued)

*Primary Examiner* — Daniel Cavallari
(74) *Attorney, Agent, or Firm* — Wolf, Greenfield & Sacks, P.C.

(57) ABSTRACT

Switched capacitor multilevel output DC-DC converters can be used as panel integrated modules in a solar maximum power point tracking system. The system can also include a central input current-controlled ripple port inverter. The system can implement per panel MPPT without inter-panel communication, electrolytic capacitors or per panel magnetics. A Marx converter implementation of the switched capacitor module is studied. Average total efficiencies (tracking×conversion) greater than 93% can be achieved for a simulated 510 W, 3 panel, DC-DC system.

19 Claims, 23 Drawing Sheets

(56) References Cited

OTHER PUBLICATIONS

Peter, P. K., "Switched capacitor DC-DC converter based maximum power point tracking of a PV source for nano satellite application," Photovoltaic Specialists Conference, 35$^{th}$ IEEE, Jun. 20-25, 2010, pp. 002604-002609.

Linares, L. et al., "Improved energy capture in series string photovoltaics via smart distributed power electronics," Applied Power Electronics Conference and Exposition, 24th IEEE, Feb. 2009, pp. 904-910.

Walker, G. et al., "Cascaded DC-DC converter connection of photovoltaic modules," Power Electronics, IEEE Transactions, Jul. 2004, pp. 1130-1139, vol. 19, No. 4.

Patel, H. et al., "MPPT scheme for a PV-fed single-phase single-stage grid-connected inverter operating in CCM with only one current sensor," Energy Conversion, IEEE Transactions, Mar. 2009, pp. 256-263, vol. 24, No. 1.

Sahan, B. et al., "A single-stage PV module integrated converter based on a low-power current-source inverter," Industrial Electronics, IEEE Transactions, Jul. 2008, pp. 2602-2609 vol. 55, No. 7.

Xiao, W. et al., "Topology study of photovoltaic interface for maximum power point tracking," Industrial Electronics, IEEE Transactions, Jun. 2007, pp. 1696-1704, vol. 54, No. 3.

Filho, F. et al., "11-level cascaded H-bridge grid-tied inverter interface with solar panels," Applied Power Electronics Conference and Exposition (APEC), 25th IEEE, Feb. 2010, pp. 968-972.

Kouro, S. et al., "Control of a cascaded H—bridge multilevel converter for grid connection of photovoltaic systems," Industrial Electronics, 35th IEEE, Nov. 2009, pp. 3976-3982.

Ozdemir, E. et al., "Fundamental-frequency-modulated six-level diode-clamped multilevel inverter for three-phase stand-alone photovoltaic system," Industrial Electronics, IEEE Transactions, Nov. 2009, pp. 4407-1415, vol. 56, No. 11.

Mousa, M. et al., "New converter circuitry for PV applications using multilevel converters," Telecommunications Energy Conference, 31st International, Oct. 2009, pp. 1-6.

Kim, K. A. et al., "Photovoltaic converter module configurations for maximum power point operation," PECI, 2010, pp. 77-82.

Krein, Philip T., and Robert S. Balog. "Cost-effective hundred-year life for single-phase inverters and rectifiers in solar and LED lighting applications based on minimum capacitance requirements and a ripple power port." *Applied Power Electronics Conference and Exposition, 2009. APEC 2009. Twenty-Fourth Annual IEEE*. IEEE, 2009.

\* cited by examiner

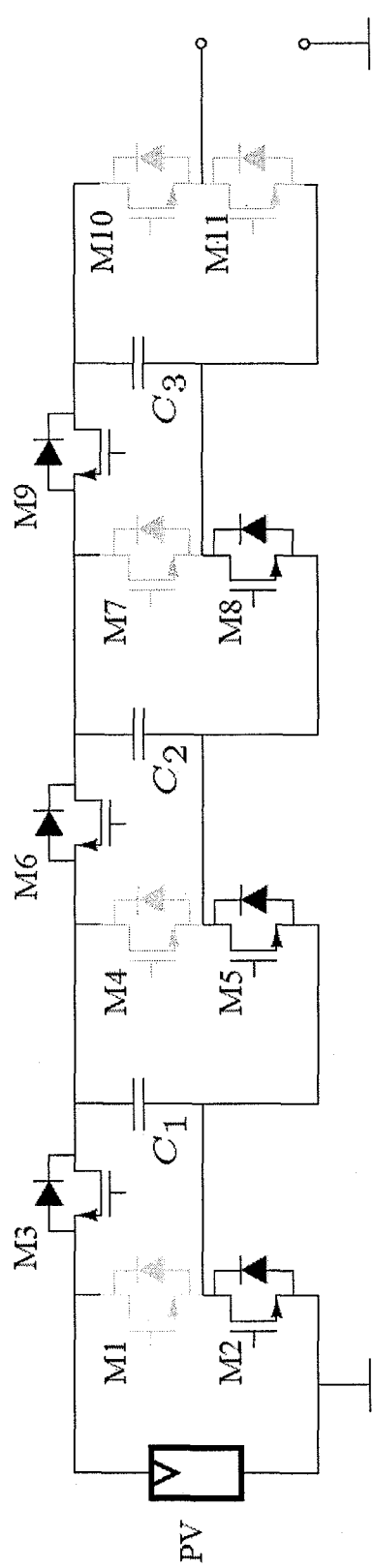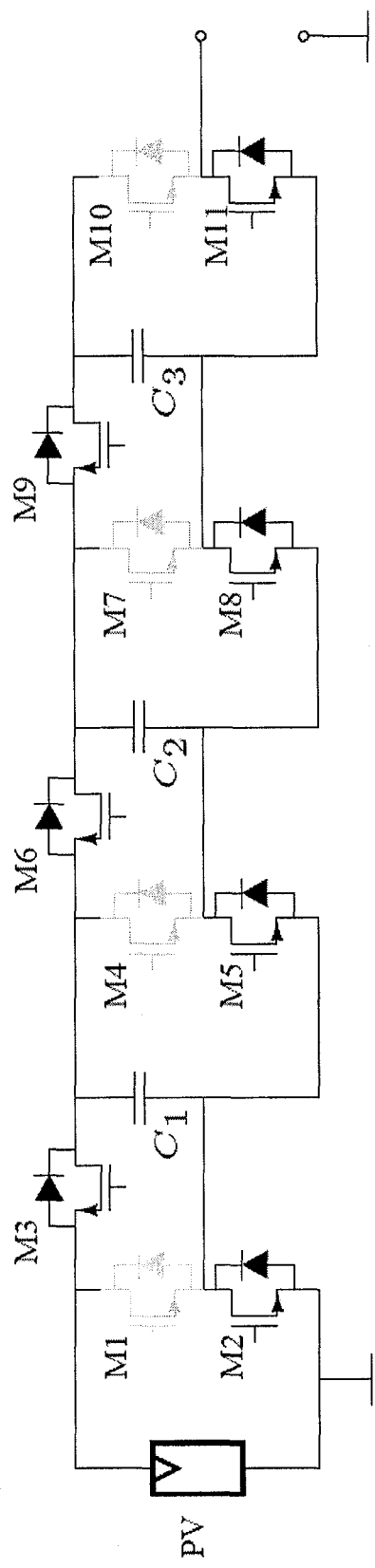
FIG. 8(a) Recharge
FIG. 8(b) $Q = 0$

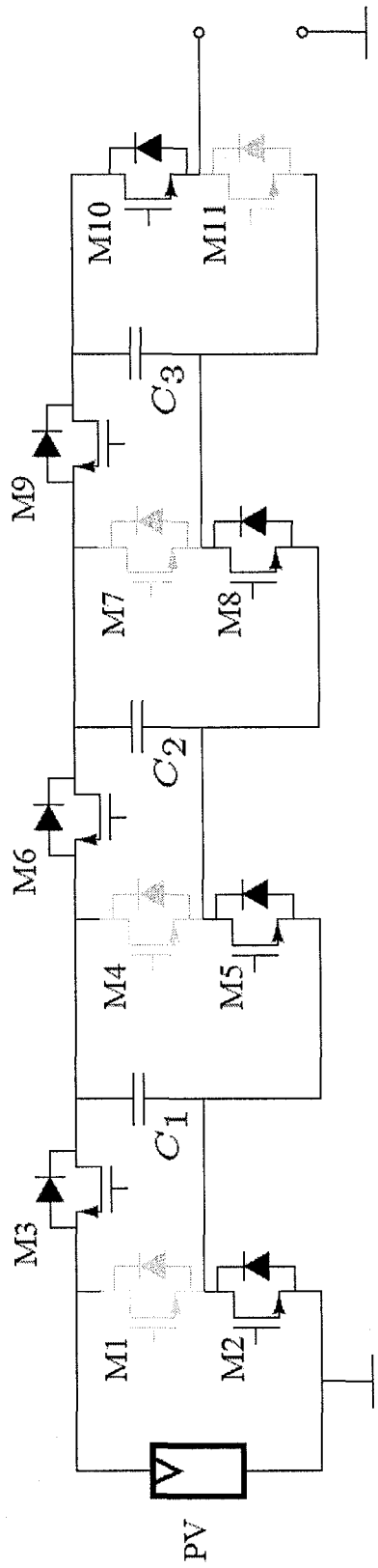
FIG. 8(c) $Q = 1$
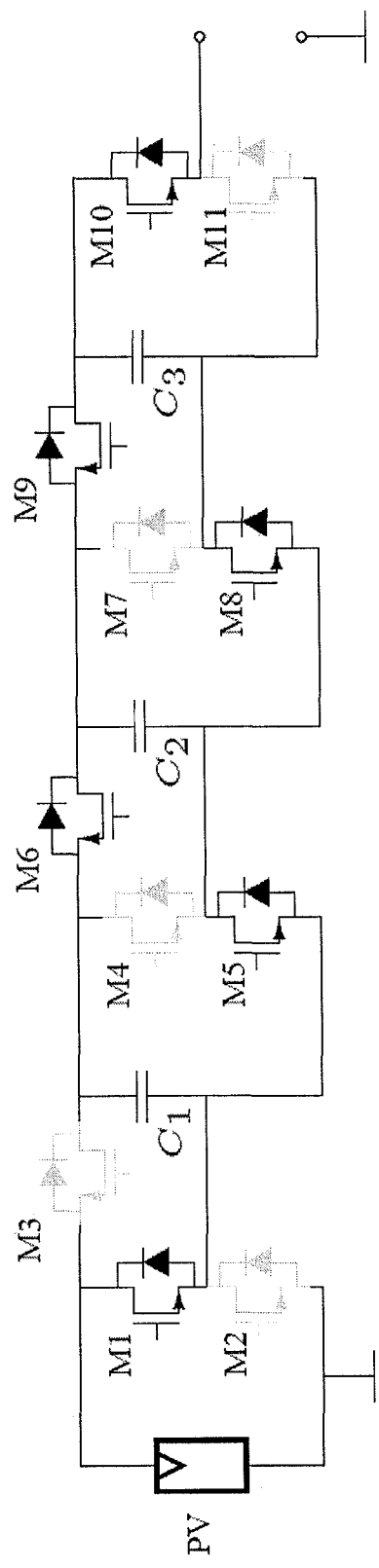
FIG. 8(d) $Q = 2$

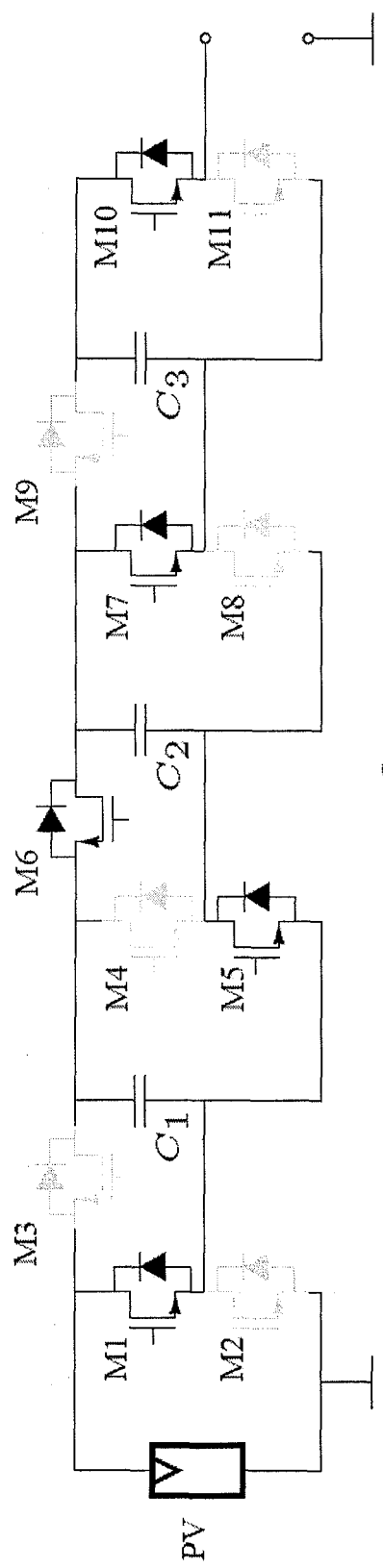
FIG. 8(e) $Q = 3$
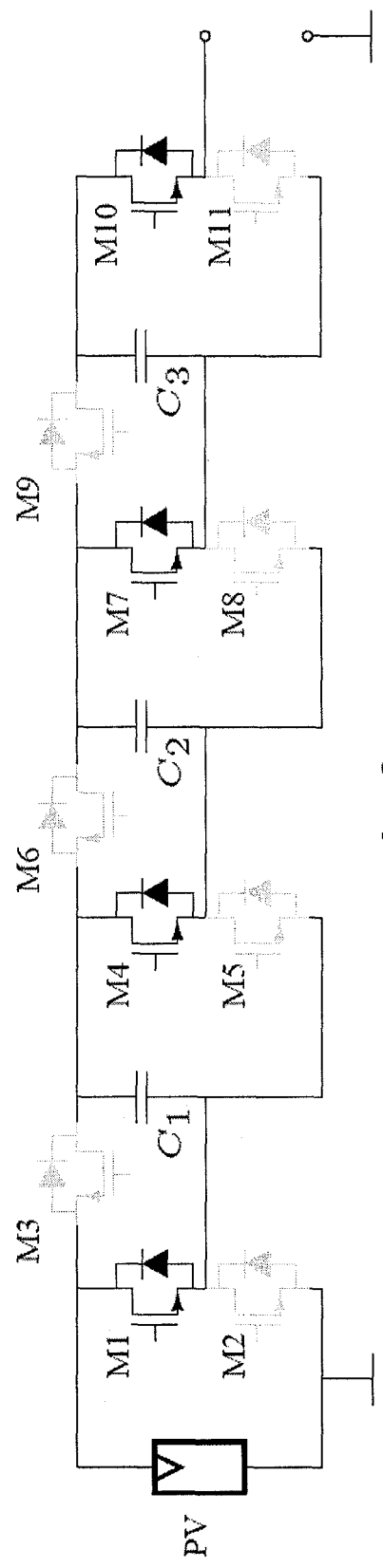
FIG. 8(f) $Q = 4$

US 9,024,478 B2

PHOTOVOLTAIC ENERGY EXTRACTION WITH MULTILEVEL OUTPUT DC-DC SWITCHED CAPACITOR CONVERTERS

BACKGROUND

1. Technical Field

The techniques described herein relate to photovoltaic systems, power converters, associated circuits and related techniques for extracting energy from photovoltaic panels.

2. Discussion of the Related Art

There are several factors limiting the widespread adoption of solar power. The total installed cost ($/W) and total cost of ownership ($/Wh) have been well-studied as key metrics controlling grid penetration. Among the factors impacting installed cost per Watt are power converter cost and system efficiency, both of which share strong relations to converter and system complexity. A significant factor impacting the cost of ownership is the lifetime of the power converter and associated replacement costs. Cost-effective solutions for solar energy extraction should address system cost and complexity, conversion and tracking efficiencies and converter lifetimes.

The amount of power extracted from a photovoltaic (PV) module depends upon the operating point at which the PV module is operated. The amount of power extracted from the PV module is optimized when the product of the current and voltage at the output of the PV module is maximized. To extract the maximum amount of power from the PV panel, the current and voltage at the output of the PV panel can be set so that the PV panel operates at its maximum power point. However, the maximum power point can change over time, due to factors such as the amount of sunlight received and the age of the PV panel. A maximum power point tracking (MPPT) algorithm embedded in the control of a converter or an inverter can be used to control the power electronics so that the current and voltage at the PV module tracks the maximum power point.

In a grid-tied system, 120 Hz power ripple at the PV panel terminals negatively impacts the tracking ability of the MPPT algorithm. This problem may be addressed by adding a large electrolytic capacitor to filter out the ripple. However, the limited lifetime of electrolytic capacitors contends directly with the long-life characteristic desired for cost-effective solar conversion. To reconcile this, the "ripple port" inverter has been proposed, which still directly interfaces with the PV unit, but directs the 120 Hz ripple power to a transformer-coupled ripple port and away from the PV unit.

SUMMARY

Some embodiments relate to a circuit for obtaining power from a photovoltaic unit. The circuit includes a DC-DC power converter configured to convert a first signal from the photovoltaic unit into a second signal using a conversion ratio selected from a set of discrete conversion ratios that the DC-DC power converter is capable of providing.

Some embodiments relate to a circuit that includes a multi-level output DC-DC switched capacitor power converter configured to receive a first signal from a photovoltaic unit and to convert the first signal into a second signal. The circuit also includes a controller configured to control the multi-level output DC-DC switched capacitor power converter using a maximum power point tracking algorithm.

Some embodiments relate to a circuit for controlling a photovoltaic system. The circuit includes a plurality of series-connected module integrated converters. Each module integrated converter includes a multi-level output DC-DC switched capacitor power converter coupled to a photovoltaic module and a first controller configured to control the multi-level output DC-DC switched capacitor power converter using a maximum power point tracking algorithm. The circuit also includes an inverter coupled to the plurality of series-connected module integrated converters. The inverter includes a second controller to control a current through the plurality of series-connected module integrated converters.

Some embodiments relate to a system for controlling a plurality of photovoltaic units. The system includes a first power converter coupled to a first photovoltaic unit and a first controller to control the first power converter to operate the first photovoltaic unit using a maximum power point tracking algorithm. The system also includes a second power converter in series with the first power converter and coupled to a second photovoltaic unit and a second controller to control the second power converter to operate the second photovoltaic unit using a maximum power point tracking algorithm. The system further includes a third controller that controls a current through the first and second power converters.

Some embodiments relate to a gate drive circuit that includes a level shift circuit and a charge pump circuit. The charge pump circuit provides a floating gate drive voltage to a transistor of a multilevel output DC-DC switched capacitor power converter based on a signal from the level shift circuit.

The foregoing summary of some embodiments is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the invention.

FIG. 8 shows switching configurations for the 5-level Marx converter in various phases of operation and for different conversion ratios.

DETAILED DESCRIPTION

Figure 1A:
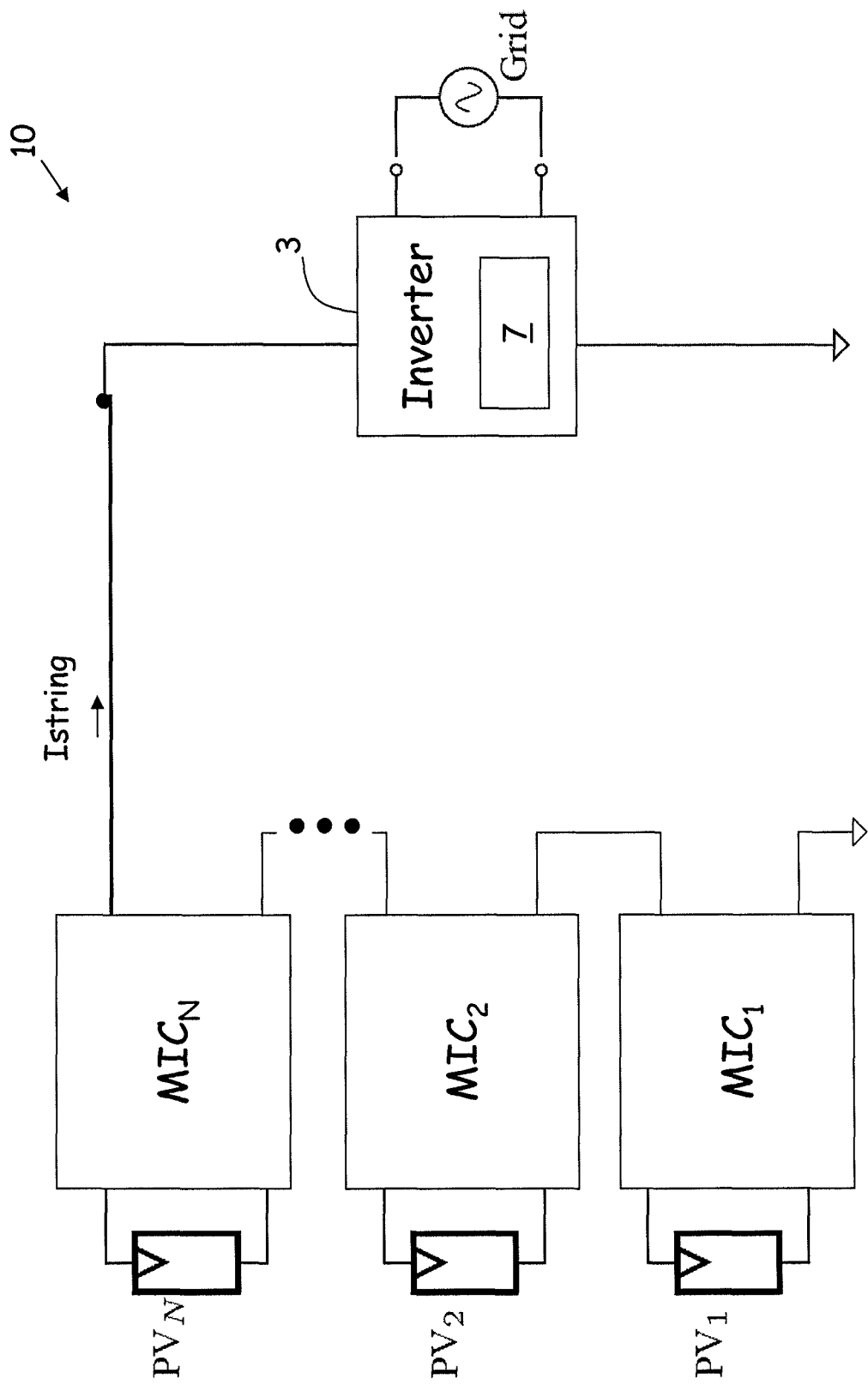
FIG. 1a shows an example of a PV system, according to some embodiments.

Implementing per panel MPPT (Maximum Power Point Tracking) at the PV module level can facilitate obtaining the maximum amount of power from each PV module despite varying light levels, temperatures, panel ages, etc. The improvements can be particularly significant with physically widespread solar arrays. With per-panel MPPT, global tracking efficiency can be significantly improved over simple series or parallel connections of PV panels, but the installation of a power converter in each panel can significantly impact the overall cost of the PV array. Power converter lifetimes and replacement costs become even more significant with per-panel conversion.

A module integrated converter (MIC) is a device that includes a power converter configured to obtain power from an individual PV module. To implement per panel MPPT, a MIC can be connected to each PV module of a solar array. In addition to having a power converter, each MIC can have a controller that runs a MPPT algorithm to determine the optimal operating point for the PV module, which may vary in response to conditions such light level, temperatures, panel age, etc. To set the operating point of the PV module to its maximum power point, the controller controls the operating point of the power converter. For example, the controller can set the conversion ratio of the power converter such that an optimal amount of current flows through the PV module to obtain the maximum amount of power from the PV module.

A typical goal of power conversion circuitry associated with a PV system is to convert DC power extracted from one or more PV modules into AC power that can be provided to the AC power grid, with high efficiency. To achieve these goals, various approaches can be taken using module integrated converters. Several types of MICs can be used, such as a DC-AC MIC or DC-DC MIC. A DC-AC MIC includes a DC-AC power converter that converts a DC signal from the PV module to an AC signal which may ultimately be provided to an AC power grid. A DC-DC MIC includes a DC-DC power converter that converts a first DC voltage and current from the PV module into a second DC voltage and current at its output. A central inverter can be used to convert the DC voltages provided by the DC-DC MICs into AC grid power.

There are advantages of a DC-DC MIC (Module Integrated Converter)+central DC-AC approach over a DC-AC MIC approach. These include the availability of a single DC bus for an entire array and intermediate power ripple filtering, as well as added degrees of freedom for MPPT control.

In some exemplary embodiments of the innovative techniques described herein, a PV system includes a plurality of PV panels, each having a DC-DC MIC for operating the individual PV panels at their maximum power points. To reduce the cost of such a system, the DC-DC MICs may be implemented with DC-DC power converters that do not include electrolytic capacitors or magnetic components. For example, as discussed in further detail below, the DC-DC power converter may be implemented as a multilevel output DC-DC switched capacitor power converter, such as a Marx converter. A central inverter connected to the DC-DC MICs can present a substantially constant current source to the DC-DC MICs, which enables decoupling the local MPPT control from that of other MICs and the global power tracking controller.

1.1 System Overview

Figure 1B:
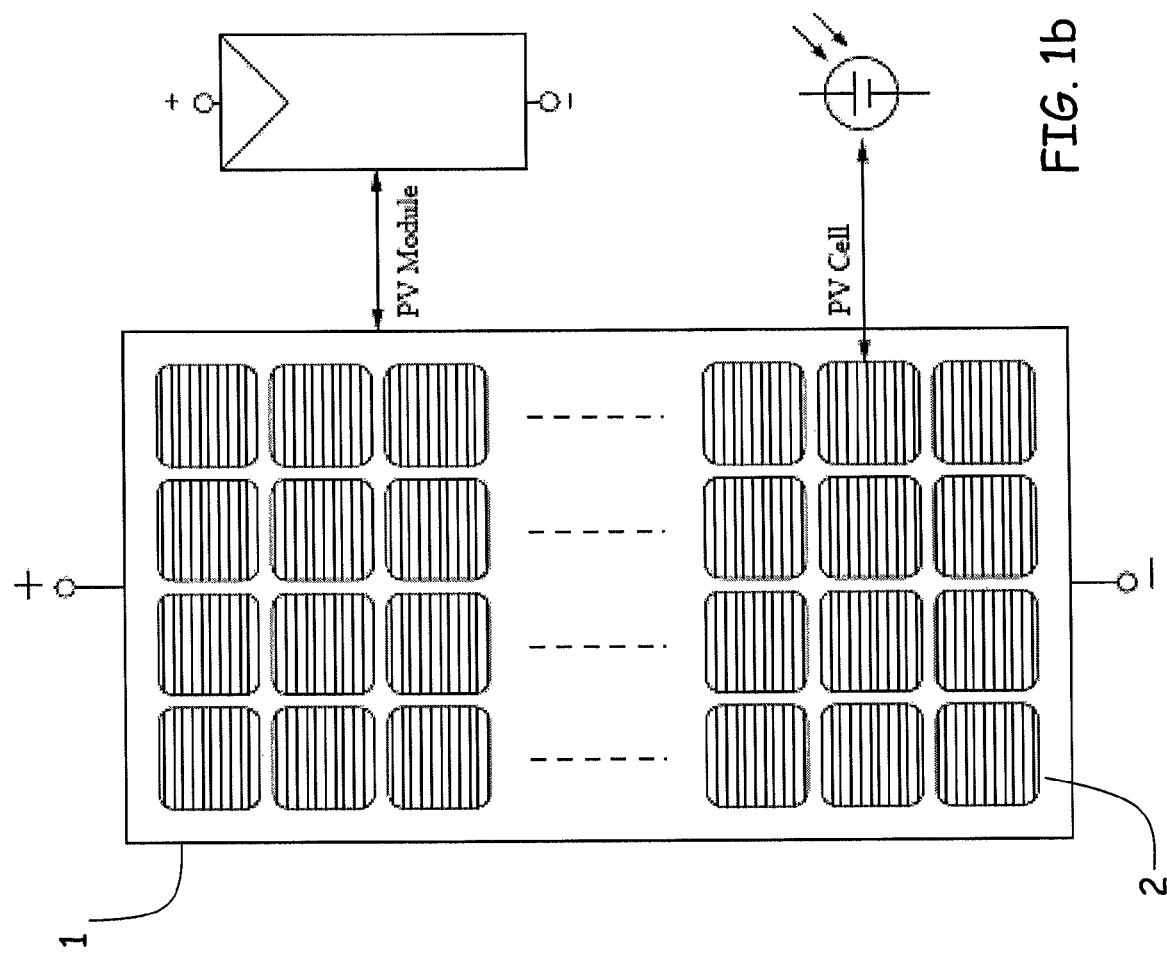
FIG. 1b shows an example of a PV module.

FIG. 1a shows an example of a PV system 10, according to some embodiments. PV system 10 includes a plurality of PV units $PV_1$, $PV_2$, and $PV_N$. As used herein, the term "PV unit" refers to any type of photovoltaic element, such as a PV cell, PV module or PV system. As shown in the embodiment of FIG. 1a, each of PV units $PV_1$, $PV_2$, and $PV_N$ can be an individual PV module (also referred to herein as a PV panel). FIG. 1b shows an example of a PV module 1 and its conventional symbol. PV module 1 may include a plurality of PV cells 2 which may be connected in series. PV module 1 typically may have a surface area on the order of about 1 m², and PV cells 2 may be approximately the size of a semiconductor wafer, e.g., around 6 inches across, for example. However, any suitable size and configuration of PV module/unit unit may be used, as the techniques described herein are not limited in these respects.

As shown in FIG. 1a, each PV unit is connected to the input of an associated MIC. For example, $PV_1$ is connected to $MIC_1$, $PV_2$ is connected to $MIC_2$ and $PV_N$ is coupled to $MIC_N$. As shown in FIG. 1a, the MICs can be connected in series with one another such that they share the same string current $I_{string}$ at their output ports. The term "string," as used herein, refers to a plurality of circuits connected in series and sharing a same string current $I_{string}$. PV system 10 also includes an inverter 3 that converts the DC string current $I_{string}$ into an AC signal. As shown in FIG. 1a, the inverter 3 can provide AC voltage to the power grid at the output of the inverter 3.

Figure 1C:
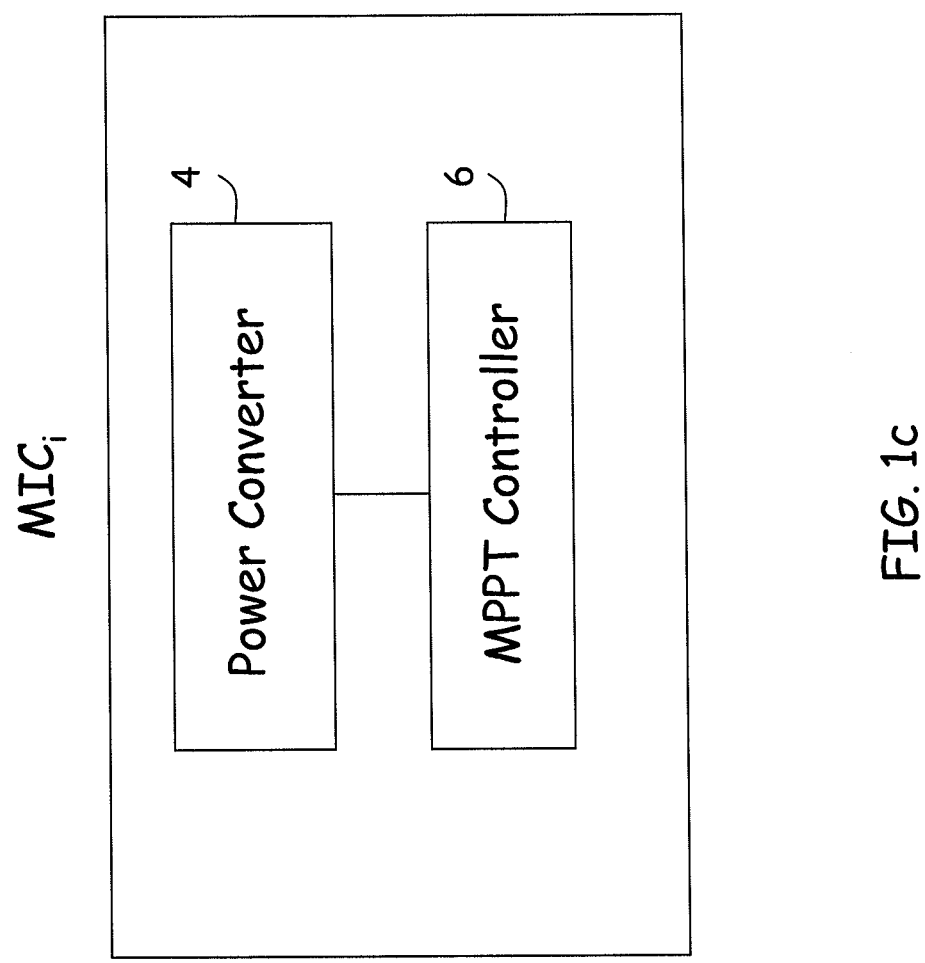
FIG. 1c shows an example of a module integrated converter (MIC), according to some embodiments.

As shown in FIG. 1c, each MIC can include a power converter 4, such as a DC-DC power converter, and a MPPT controller 6 to control the power converter. The input port of the power converter can be coupled to the terminals of an associated PV unit. The output port of the power converter can be coupled to the output ports of the power converters of other MICs in a series combination, as shown in FIG. 1a. However, the techniques described herein are not limited to a series combination of MICs, as the MICs could be connected in parallel, in a combination of series and parallel, or in another configuration. For purposes of illustrating the techniques described herein, the series combination of MICs shown in FIG. 1a will be discussed by way of example.

In some embodiments, the power converter 4 may be implemented as a multilevel output DC-DC switched capacitor power converter, such as a Marx converter, for example. Such a converter can convert an input DC level into an output DC level using a selected conversion ratio from a set of conversion ratios that can be implemented by the converter (e.g., from 0 to a maximum integer value). Advantageously, using a multilevel output DC-DC switched capacitor power converter as the power converter 4 may provide a low component-cost power converter with a long lifespan. By contrast, conventional DC-DC converters often use magnetic components, such as inductors or transformers, as energy storage elements. However, the component cost of magnetic components can be prohibitive. In some embodiments, power converter 4 may not include any magnetic components such as inductors or transformers (though parasitic inductances may be present). An exemplary multilevel output DC-DC switched capacitor power converter and the operation thereof will be discussed further below with reference to FIGS. 7 and 8.

MPPT controller 6 may be implemented using any suitable microprocessor or using dedicated hardware, for example. MPPT controller 6 can execute instructions to control the power converter 4 to extract power from the associated PV unit at approximately its maximum power point. For example, the MPPT controller can control the conversion ratio of the power converter 4 so that the current and/or voltage produced at the terminals of the PV unit will result in maximum power extraction from the PV unit. The MPPT controller 6 may execute a perturb-and-observe algorithm or other MPPT algorithm such as those known in the art. However, any suitable MPPT algorithm may be used, as the techniques described herein are not limited to a particular MPPT algorithm.

In the PV system of FIG. 1a, the inverter 3 can control the string current $I_{string}$. For example, the inverter 3 can include a controller 7 that executes instructions to control the inverter 3 to establish a particular string current $I_{string}$. Alternatively, the controller 7 can be separate from the inverter 3. In some embodiments, the string current can be controlled by controller 7 to be substantially constant. Advantageously, by providing a substantially constant string current, the MPPT algorithms run by the individual MICs can be decoupled from one another, as the current through the string of MICs is, at least temporarily, independent of the operating parameters of any particular PV unit. Thus, each MIC can optimize the power extracted from its PV unit without being affected by the varying electrical characteristics of the other MICs in the string as they attempt to maximize their MPP.

To find the global maximum power point, the controller 7 can gradually change the string current to different values across a range of current values. For each string current value, the MICs can determine the maximum power points of the individual PV units. In some embodiments, the rate at which the MICs change their operating parameters in response to the MPPT algorithm run by MPPT controller 6 can be much faster than the rate at which controller 7 changes the string current to different values. Thus, due to the difference in control speed, even if controller 7 continuously changes the string current, the string current will appear to be substantially constant to the individual MICs, due to the much higher rate at which the MICs can change the operating parameters of the PV panels. As the string current is changed through a range of values, the controller 7 can save an indication of the total amount of power produced at different string currents (e.g, see FIG. 5). After sweeping through a range of options, the controller 7 can determine which string current resulted in the highest total power production. The controller 7 can then select this optimal string current and control inverter 3 such that the optimal string current flows through the inverter 3. Such a procedure may be repeated at various intervals to re-optimize the string current.

Although a technique has been described for tracking the global MPP by sweeping through various string currents, any suitable algorithm may be used by controller 7 for tracking the global MPP, as the techniques described herein are not limited to the use of a particular algorithm for tracking the global MPP.

Advantageously, the control implemented within the MICs and controller 7 can be performed autonomously by each device. No communication is needed between the MICs or the controller 7, which can reduce the cost of providing communication lines or a communication network between the MICs and controller 7. However, communication between the MICs and/or the controller 7 may be provided, if desired for a particular implementation.

Figure 1D:
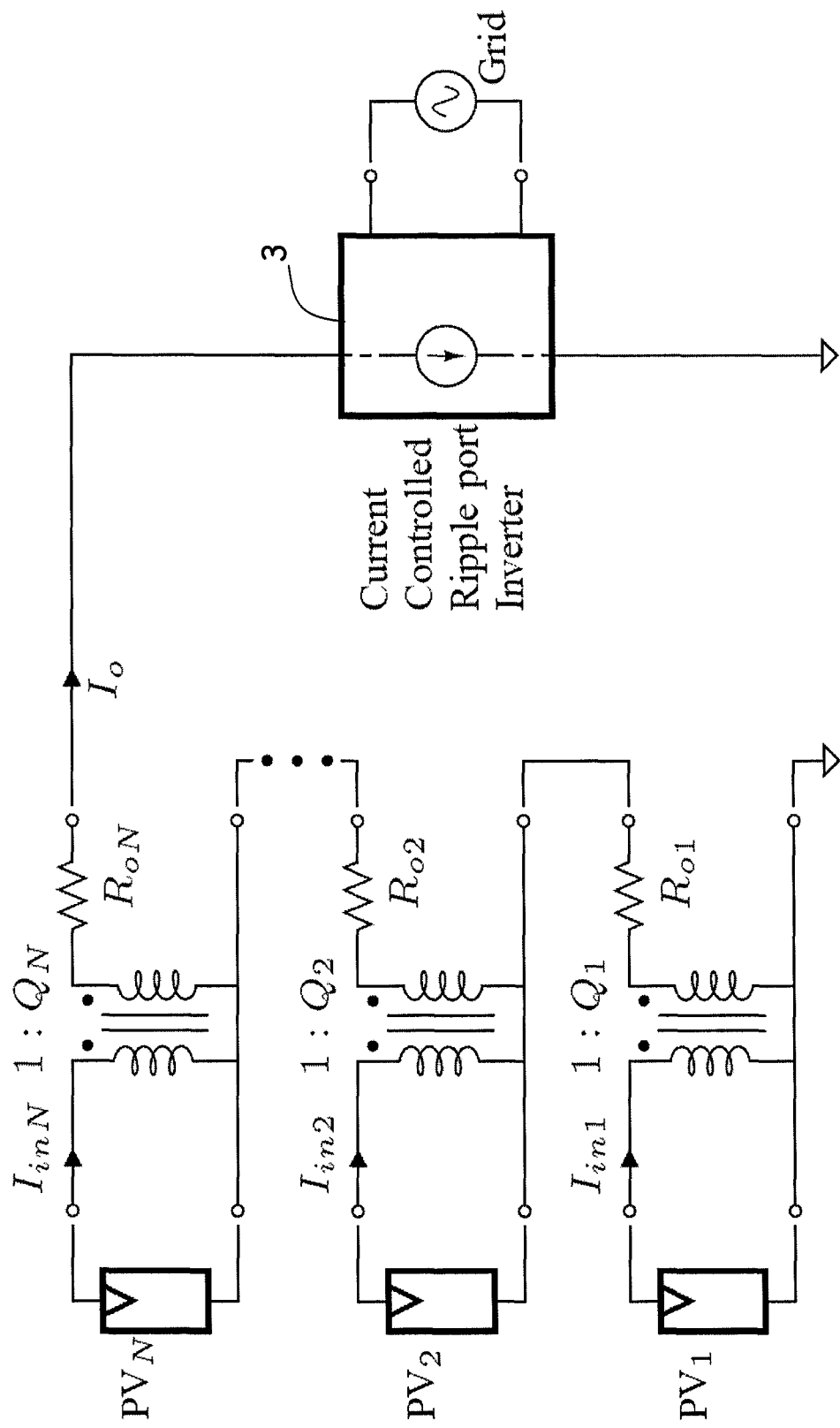
FIG. 1d shows a DC linearized circuit model of the PV system of FIG. 1a with DC-DC MICs.

The system level approach is further illustrated by the DC linearized circuit model with an N-panel PV string with DC-DC MICs, as shown in FIG. 1d. Ideal transformers can be used to model the function of DC-DC MICs, with the integer number of turns on the secondary, $Q_i$, representing the conversion ratio of the DC-DC MIC when implemented as a multilevel output DC-DC switched capacitor converter. The DC-DC module conversion ratios are selectable, but discrete. The conversion ratio $Q_i$ is the ratio between the input voltage of the DC-DC power converter and its output voltage. Due to the finite number of discrete conversion ratios $Q_i$, the output of the converter will have one of a set of levels for a given input, depending on the conversion ratio chosen.

As discussed above, the responsibility of MPPT is shared among the DC-DC MICS and the central inverter. As a result, the required complexity of the DC-DC MICs is simplified. A central ripple-port inverter can be used as inverter 3 to reduce the AC ripple that reaches the MICs. Per panel magnetics can be eliminated as well as electrolytic capacitors. Any magnetics that are used for the ripple port inverter need only be purchased once per string.

As used herein, the term "ground" and its associated symbol(s) can refer to various reference voltages such as a local panel "ground" or a floating ground reference. For example, when connected in a series string, each PV panel and MIC can be referenced to a different potential. Thus, as used herein, the term "ground" and its associated symbol(s) do not necessarily refer to earth ground, i.e., the potential of the earth. Rather, the term "ground" and its associated symbol(s) herein refer to a voltage reference which may be constant in some cases. However, in some embodiments particular circuits may be referenced to earth ground depending on their configuration.

1.2 Switched Capacitor Benefits

Figure 2:
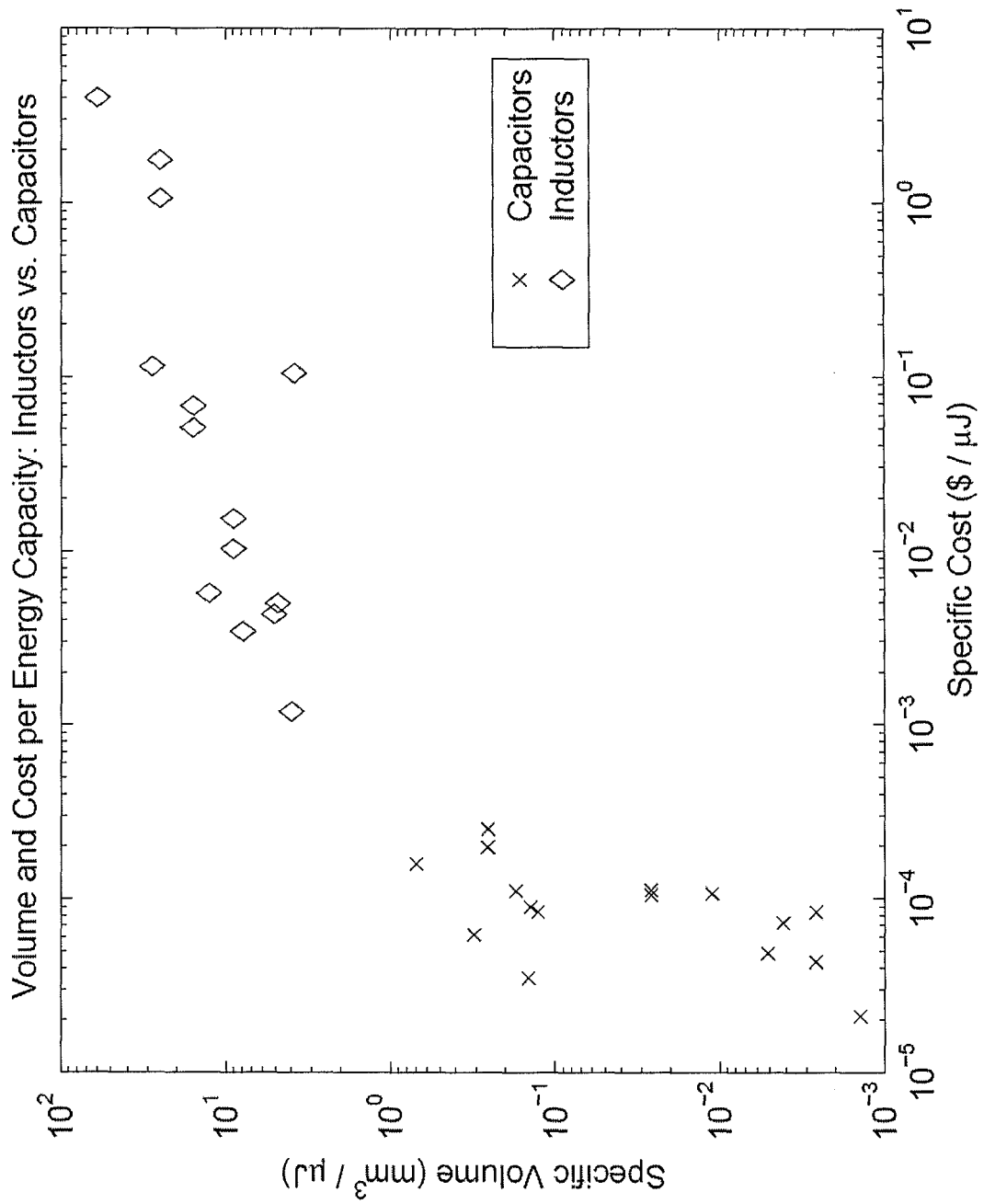
FIG. 2 shows the cost and volume per energy storage for a sample of discrete capacitors and inductors suitable for power applications.

Switched capacitor converters achieve current and voltage conversion without magnetic energy storage (aside from that inherent in parasitic inductances present in wires of any length). FIG. 2 shows the cost and volume per energy storage (µJ) for a sample of discrete capacitors and inductors suitable for power applications, including discrete inductors (10 µH-1 mH/100 mA-1 A) and capacitors (Ceramic and Film 1-10 µF/10-100 V) sampled from a commercial catalog. Energy storage was calculated as $½CV^2$ or $½LI^2$ for maximum rated voltages and currents. These data imply a-priori expected cost and volume benefits of switched capacitor converters when compared to inductor-based converters.

1.3 Total Efficiency

Total efficiency is an important parameter in the design and evaluation of PV systems. Here we define total efficiency, $\eta$, as the product of tracking efficiency, $\eta_p$, and conversion efficiency, $\eta_c$:

$$\eta = \eta_p \times \eta_c. \tag{1}$$

Tracking efficiency can be defined as the power produced at the operating point of the PV unit divided by the power that would be produced at the PV unit's maximum power point. Conversion efficiency can be defined as the power provided at the output of the power electronics divided by the power produced by the PV units at the input of the power electronics.

Figure 3:
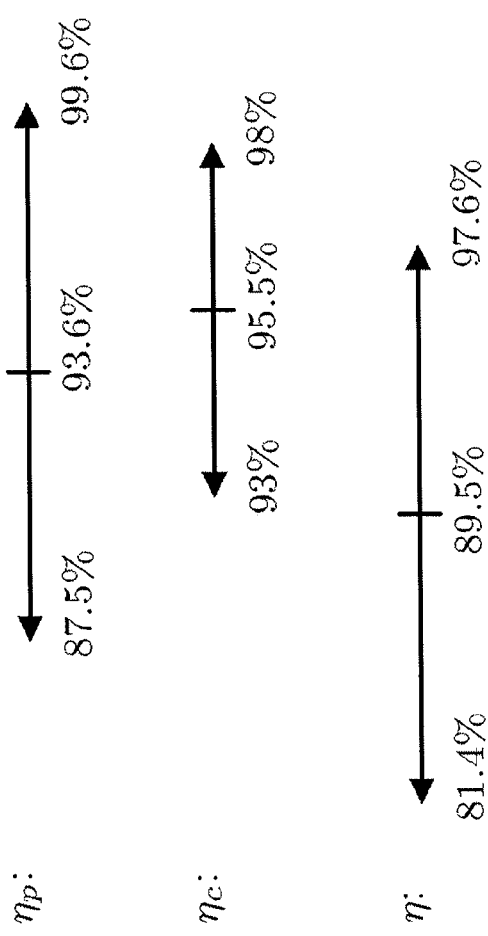
FIG. 3 shows a sampling of tracking and conversion efficiencies reported in the literature for MPPT algorithms and DC-DC MICs, respectively, as well as calculated total efficiencies.

FIG. 3 depicts a sampling of tracking and conversion efficiencies reported in the literature for MPPT algorithms and DC-DC MICs, respectively. The two ranges of efficiencies can be multiplied yielding a third range corresponding to total efficiency, $\eta$, as shown in FIG. 3.

2 Maximum Power Point Tracking

Maximum power point tracking in the system of FIG. 1a is simplified by the input current control of the central inverter 3 and the series connection of the MICs. The selectable conversion ratios, $Q_i$, allow the DC-DC MICs to track local MPP's as the string current slowly varies. The central inverter can track the global MPP by adjusting its input current.

The run-time global MPPT can be implemented by exploiting time-scale separation. As discussed above, the local MPPT control at the MICs can operate relatively quickly, and the global MPPT control can operate relatively slowly. Specifically, on the time-scale of local MPPT control, the string current, $I_o$, may be taken to be static or "quasi-static." Because the maximum power point of each panel is defined by a unique maximum power current, $I_{mp,i}$, the quasi-static string current naturally decouples MPPT control among the modules.

2.1 PV Model

Figure 4:
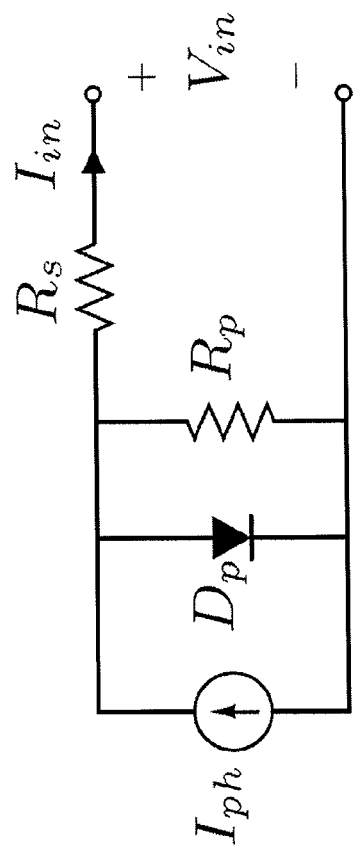
FIG. 4 shows a model of a photovoltaic panel.

FIG. 4 shows a model of the photovoltaic panel and its parameters. Given the parameters quoted in a typical datasheet, $V_{oc}$, $I_{sc}$, and the maximum power voltage and current, $V_{mp}$, and $I_{mp}$, analysis of the circuit in FIG. 4 yields $$V_{dp} = V_{oc} \qquad (2)$$

$$R_s = \frac{V_{oc} - V_{mp}}{I_{mp}} \qquad (3)$$

$$R_p = \frac{I_{sc} R_s - V_{oc}}{I_{mp} - I_{sc}} \qquad (4)$$

$$I_{ph} = I_{mp} + \frac{V_{fwd}}{R_p}, \qquad (5)$$

where $V_{dp}$ is the forward voltage of the diode, $D_p$, in the model. In FIG. 4, when $I_{in} < I_{mp}$, the diode, $D_p$, is forward-biased and it is reverse-biased otherwise. The resulting panel voltages are $$V_{in} = V_{dp} - I_{in} R_s, I_{in} < I_{mp}$$

$$V_{in} = R_p I_{ph} - (R_s + R_p) I_{in}, I_{in} \geq I_{mp} \qquad (6)$$

and the panel power is simply $$P_{in} = I_{in} V_{in} \qquad (7)$$

The following nominal datasheet values were adapted from a MITSUBISHI PV-MF170EB4:

$$I_{mp} = 6.93 A$$

$$V_{mp} = 24.6 V$$

$$I_{sc} = 7.38 A$$

$$V_{oc} = 29 V \qquad (8)$$

2.2 Local Maximum Power Point Tracking

Local MPPT control can be performed by matching the string current to the panel's own $I_{mp,i}$'s. From FIG. 1d, the $i^{th}$ panel current is $$I_{in,i} = Q_i I_o. \qquad (9)$$

Given a quasi-static string current, $I_o$, the modules each choose a $Q_i$ to maximize their panel power. This maximization step can be performed a number of ways. For instance, the modules may estimate their $I_{mp,i}$'s via short-circuit current measurements. A perturb and observe step may be used to provide good accuracy following the initial $I_{mp}$ guess.

In the simulations that follow, the local algorithm for choosing conversion ratios was implemented as follows. Given $I_{mp,i}$ either by the short-circuit method described above or otherwise, the modules attempt to minimize the error $|I_{in,i} - I_{mp,i}|$. This minimization is constrained according to the non-linear behavior of the PV indicated in FIG. 4. Combining equations (6) and (7), the panel power for the $i^{th}$ panel can be written:

$$P_{in,i} = I_{in,i} V_{dp,i} - I_{in,i}^2 R_{s,i}, I_{in,i} < I_{mp,i}$$

$$P_{in,i} = I_{in,i} R_{p,i} I_{ph,i} - (R_{s,i} + R_{p,i}) I_{in,i}^2, I_{in,i} \geq I_{mp,i}. \qquad (10)$$

Taking the derivative of (10) with respect to $I_{in}$ yields $$\frac{\partial P_{in,i}}{\partial I_{in,i}} = V_{dp,i} - 2 I_{in,i} R_{s,i}, I_{in,i} < I_{mp,i} \qquad (11)$$

$$\frac{\partial P_{in,i}}{\partial I_{in,i}} = R_{p,i} I_{ph,i} - 2(R_{s,i} + R_{p,i}) I_{in,i}, I_{in,i} \geq I_{mp,i}.$$

The term, $-2(R_{s,i} + R_{p,i}) I_{in,i}$, in the derivative typically leads to a steep decrease in panel power for $I_{in,i} \geq I_{mp,i}$. Absolute errors $|I_{in,i} - I_{mp,i}|$ impact the panel power less for $I_{in,i} < I_{mp,i}$. Accordingly, a suitable algorithm can attempts to minimize the error $|I_{in,i} - I_{mp,i}|$ with the following order of preference:
1. $I_{in,i} = I_{mp,i}$
2. $I_{in,i} < I_{mp,i}$
3. $I_{in,i} > I_{mp,i}$.

In the examples presented here, the DC-DC modules each continuously attempt to match the string current to their own MP currents according to the above algorithm. Generally, the MICs can choose from a set of integral conversion ratios $[0, 1 \ldots Q_{max}]$. The Q=0 module configuration can assist in providing good average tracking efficiency. It represents the option for a panel to "sit out" when its maximum power is so low that including it in the string would have a negative impact on the global MPP.

2.3 Global Maximum Power Point Tracking

Figure 5:
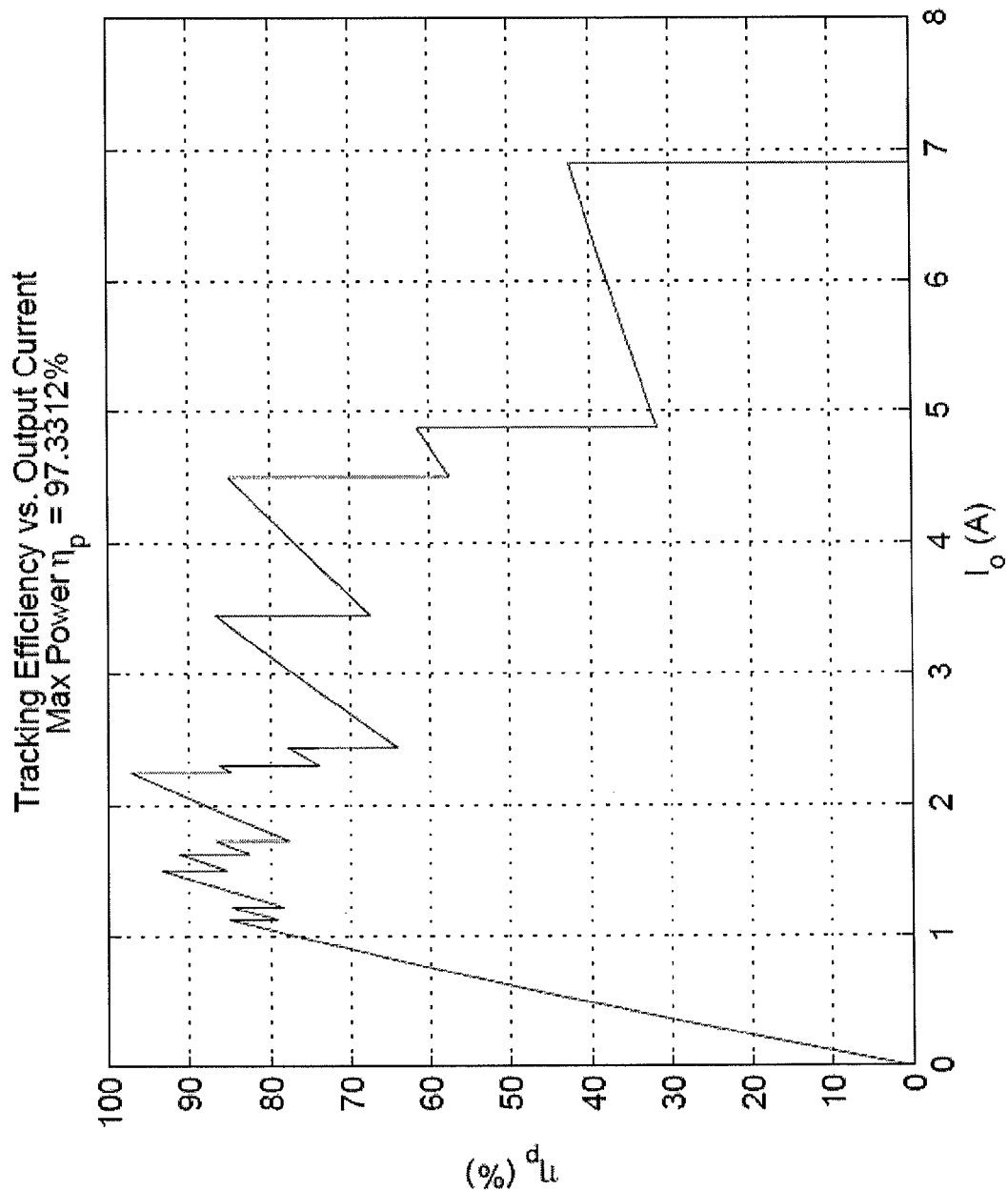
FIG. 5 shows an plot of the tracking efficiency achieved as the string current is changed.

As discussed above, the string inverter 3 can track the global MPP by adjusting its input current. FIG. 5 depicts an example of the tracking efficiency achieved as $I_o$ is swept, while the DC-DC modules adjust their conversion ratios. FIG. 5 shows a single $I_o$ sweep in a simulated system with 3 panels, $Q_{avail} = [0, 1, 2, 3, 4]$, $I_{mp,vec} = [6.898, 4.503, 4.878]$ A, and $\Delta I_o = 1$ mA. For this example, and for the rest of this section, tracking efficiency is considered in an otherwise lossless system ($\eta_c = 100\%$). Section 4 addresses the effect of converter efficiency on MPPT control.

The $I_o$ sweeps, like the one depicted in FIG. 5, may be performed on a scheduled basis. Alternatively, $I_o$ may be varied continuously according to a particular runtime MPPT algorithm. Section 4.5 presents a simulation of an example of an input current-controlled inverter.

2.4 Statistical Performance Evaluation

A statistical performance evaluation method was adopted to account for variations in panel MPP's. Monte Carlo simulations were performed by selecting random (normalized) $I_{mp,i}$'s for each panel. For each simulation, the string current, $I_o$, was swept as in FIG. 5 and the maximum efficiencies (tracking, converter, and total) were recorded. Repeating this many times and averaging the results yielded a prediction of average performance. An example output plot is shown in FIG. 6 for $Q_{avail}=[0:1:Q_{max}]$, Monte Carlo Length=200, $I_{o,sweep}=[0.01:0.02:6.93]$ A.

Figure 6:
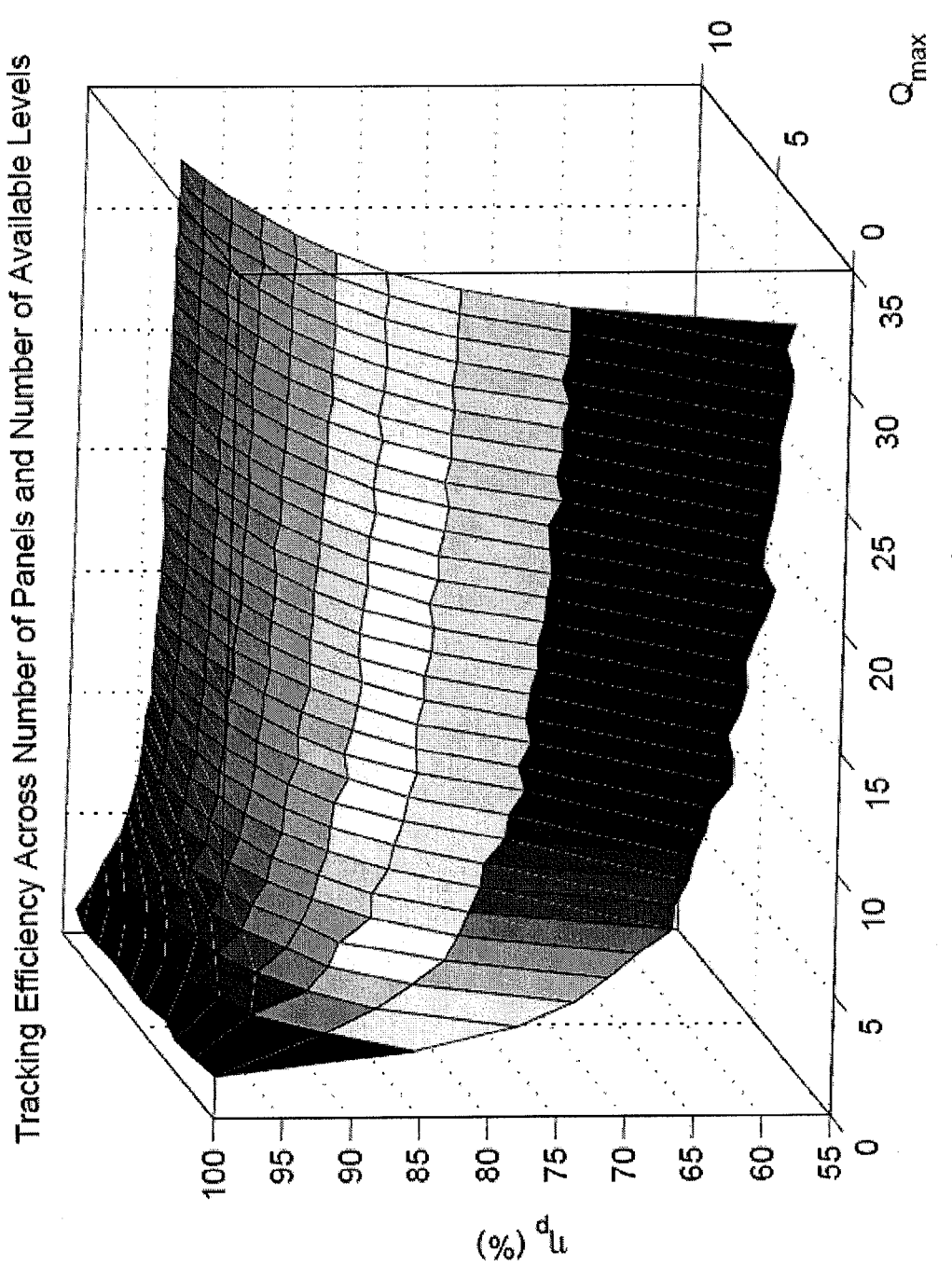
FIG. 6 shows a plot of the tracking efficiency versus the number of panels used and the maximum conversion ratio used for the DC-DC power converter.

The plot in FIG. 6 shows that tracking efficiency can be very high for only a few panels. As panels are added, $\eta_p$ diminishes to a limited extent. The local MPPT algorithm implemented impacts this behavior significantly. For instance, if the order of preferences listed in Section 2.2 is reversed, the tracking efficiency diminishes steadily as panels are added rather than flattening as it does in FIG. 6. The Monte Carlo simulation results also show how average tracking efficiency improves as the number of available levels increases. The tracking efficiency predicted for a 3-panel, 5-level system is approximately 90%. Increasing the number of available levels to 8 increases the predicted tracking efficiency to 95%, in this simulation. Thus, in some embodiments, a multilevel output DC-DC switched capacitor capacitor power converter for a PV unit may be capable of selecting from a relatively small number of conversion ratios such as no more than five, no more than eight, or no more than ten conversion ratios, for example, which can simplify the converter circuit and operation. However, the techniques described herein are not limited as to converters with a low number of possible conversion ratios, as converters with larger numbers of conversion ratios may be used, in some implementations.

Finally, it should be noted that the $Q_{max}=1$ case (i.e. $Q_{avail}=[0,1]$) is somewhat representative of a simple series string of panels with bypass diodes. The statistical data predict roughly 65% average tracking efficiency while a 5-level MIC would improve that efficiency to roughly 90%, in these simulations.

2.5 Effect of Spatial Panel Separation

In the above example, the panels are assumed to have a random and uncorrelated distribution of MPP's. This model becomes less appropriate as panels become closely spaced. To model the effect of statistical correlation between MPP's for panels arranged in a non-infinite area, the randomly assigned panel MPP's can be constrained to a fraction of the full range. The simulation above was repeated having forced the MPP's to lie within 50% of the full range for each Monte Carlo iteration. The results show universally higher average tracking efficiencies. For instance, the tracking efficiency predicted for a 3-panel, 5-level system is approximately 95.5% and for a 3-panel, 8-level system, 97.4%.

2.6 Non-Integral Level Selections

As described herein with respect to the Marx converter, switched capacitor multilevel converters can have integral, boosting sets of conversion ratios. In a boosting switched capacitor multilevel converter, the input voltage is multiplied by approximately the integral conversion ratio to determine the output voltage of the converter. When the conversion ratios Q are limited to a fixed number of integer values, the output of the converter is limited to a fixed number of discrete levels for a given input. However, other switched capacitor topologies can be used that achieve rational or bucking conversion ratios. When a bucking converter is used, the input voltage can be divided by an integral conversion ratio to determine the output voltage. A combination of a bucking and boosting topology may be used to achieve rational conversion ratios (e.g., 2/3, 4/3, etc.) rather than integral conversion ratios (e.g., 1, 2, 3). Such topology choices may be beneficial when considering upper bounds on DC bus voltages or other practical issues.

3 Switched Capacitor Implementation

Figure 7:
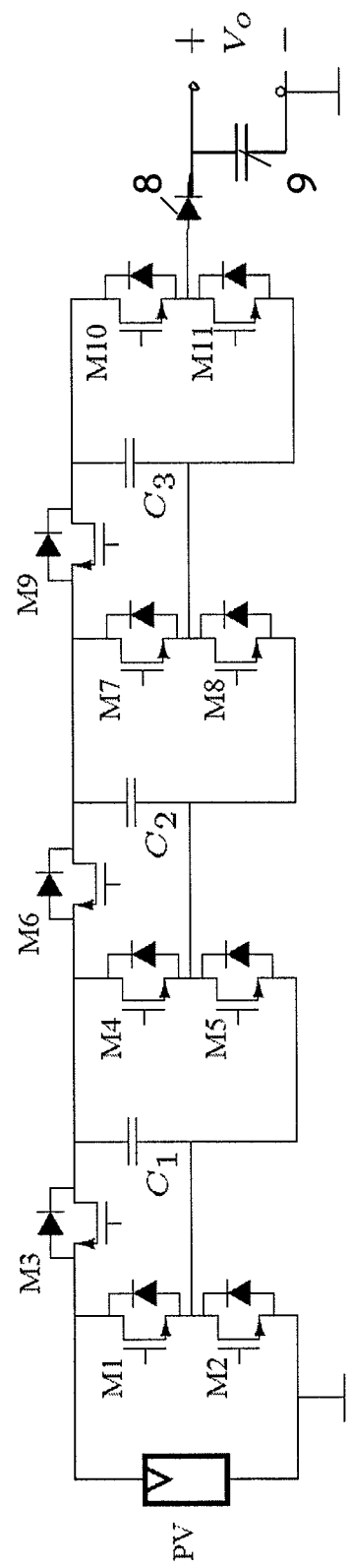
FIG. 7 shows an example of a 5-level Marx converter, according to some embodiments.

FIG. 7 shows a particular embodiment of the switched capacitor MICs in FIG. 1d: the Marx multilevel converter. By forming series and parallel combinations of the input source and the switched capacitors, the 5-level Marx converter shown in FIG. 7 can achieve conversion ratios $Q_{avail}=[0, 1, 2, 3, 4]$. Exemplary switching patterns for achieving these conversion ratios are discussed in the following section.

As shown in FIG. 7, a power diode 8 can be coupled at the output of the Marx converter to limit the direction of current flow. Power diode 8 will be discussed in further detail below. An output capacitor 9 can be connected between the output terminal of the diode and ground to smooth variations in the output voltage of the Marx converter. The output of the Marx converter can be taken across the output capacitor 9.

3.1 Efficient Switching Patterns

Switching cycles include a recharge phase, $\phi_1$, and an output phase, $\phi_2$. During $\phi_1$, the switched capacitors are disconnected from the load and charged in parallel with the source. During $\phi_2$, one of several series-parallel configurations of the switched capacitors and input source is chosen to achieve the desired conversion ratio. A Marx converter may switch between any one or more of the switching configurations shown herein. However, many other switching configurations can be implemented, including redundant configurations.

The switching configurations shown in FIG. 8 were chosen for the 5-level Marx converter to minimize the conduction losses that will be quantified shortly. FIG. 8(a-f) show switching configurations in the recharge phase (FIG. 8a) and for the five conversion ratios. In FIG. 8, a grayed-out transistor indicates that the transistor is turned off, and a transistor shown in black indicates that the transistor is turned on. Generally, the exemplary switching configurations were chosen to minimize capacitor droop and the number of switches in the output current path, both of which lead to loss and load regulation. Capacitor droop can be minimized by 1) utilizing the input source to drive the output during $\phi_2$ when possible and 2) utilizing all of the switched capacitors when driving the output, e.g. parallel-connect redundant capacitors when possible.

Switched capacitor circuits can achieve very high conversion efficiency by minimizing the instantaneous current flow through their effective output resistance, $R_{out,i}$. In a DC-DC switched capacitor circuit, the output is slowly-varying on the time-scale of one switching period. These facts guide us to particular modes of operation. In particular, efficient operation can be achieved when the same output phase ($\phi_2$) configuration is repeated every cycle. In contrast, modulation of the $\phi_2$ configuration on a per cycle basis, e.g. to achieve intermediate conversion ratios, may lead to continuously varying open circuit converter voltages resulting in high instantaneous currents (high AC rms currents) through $R_{out,i}$. We have found that the Marx multilevel converter can efficiently achieve a discrete set of conversion ratios.

3.2 Linear Modeling

A linear modeling approach yielded quantitative support for the linear circuit models shown in FIG. 1d including the output resistances, $R_{out,i}$ which represent both loss and load regulation in the switched capacitor circuits.

3.3 Switching Speed Limit Definitions

Loss and load regulation mechanisms can be differentiated among two switching speed limiting cases. In the slow-switching-limit (SSL), the switched capacitors fully equilibrate, yielding impulsive capacitor currents. In the fast-switching-limit (FSL), the switched capacitors maintain fixed voltages while capacitor currents during each switching state are constant.

Figure 9:
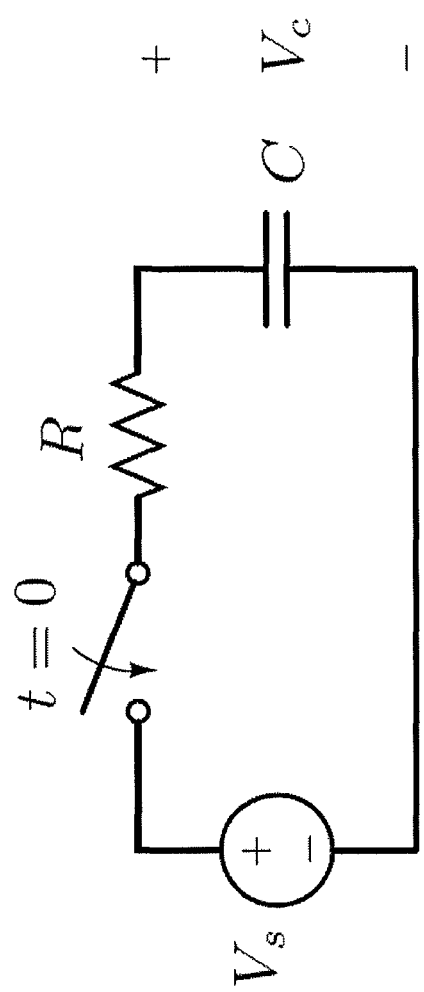
FIG. 9 shows a circuit model for modeling capacitive switching loss.

The two switching speed limits can be understood by considering the classic capacitor charging loss problem depicted in FIG. 9. The total energy lost in charging the capacitor is the time-integral of $I_C(t)^2 R$:

$$E_{tot} = -\frac{(V_s - V_C(0))^2}{2R} RC(e^{-2t/RC})\Big|_0^t. \quad (12)$$

In the SSL, the exponential term is allowed to collapse to −1 and the energy lost becomes $$E_{tot,SSL} = \tfrac{1}{2} C \Delta V_C^2, \quad (13)$$

independent of R, and in agreement with the classical result. In the FSL, (12) can be viewed near t=0 with the Taylor series approximation to the exponential term. This leads to $$E_{tot,FSL}(t) = \frac{(V_s - V_C(0))^2 t}{R}, \quad (14)$$

i.e. the loss we would expect for two fixed voltages connected across the resistor. These two loss mechanisms yield asymptotic limits to the output resistance with proportionalities as follows:

$$R_{SSL} \propto \frac{1}{Cf_{sw}} \quad (15)$$

$$R_{FSL} \propto R_{ds,on}.$$

The method developed in the paper *M. Seeman and S. Sanders, "Analysis and optimization of switched-capacitor dc-dc converters," Power Electronics, IEEE Transactions on, vol. 23, no. 2, pp. 841-851, March 2008* for computing the multipliers to quantify $R_{SSL}$ and $R_{FSL}$ was adapted to the Marx multilevel converter here. The results are summarized in Tables 1 and 2 for Marx converters having between two and eight available levels. Note that the multipliers in the tables need to be computed for each conversion ratio (switching pattern) for each number of available levels (topology). Also note that $R_{FSL}$ depends on the duty ratio between $\phi_1$ and $\phi_2$, which was taken as D=0.5 for all switching patterns here. Given the asymptotic limits, the actual output resistance for any combination of topology, C, $f_{sw}$, and $R_{ds,on}$ is generally $$R_{out} = \max(R_{FSL}, R_{SSL}) \quad (16)$$

and the conduction loss per module is $$P_{rloss} = I_o^2 R_{out}. \quad (17)$$

TABLE 1

$R_{SSL}$ Multipliers: ($\times 1/Cf_{sw}$)

| Levels Available: | 2 | 3 | 4 | 5 | 6 | 7 | 8 |
|---|---|---|---|---|---|---|---|
| Q = 0 | 0 | 0 | 0 | 0 | 0 | 0 | 0 |
| Q = 1 | 0 | 0 | 0 | 0 | 0 | 0 | 0 |
| Q = 2 | — | 1 | 1/2 | 1/3 | 1/4 | 1/5 | 1 |
| Q = 3 | — | — | 2 | 3/2 | 1 | 5/6 | 2/3 |
| Q = 4 | — | — | — | 3 | 5/2 | 2 | 3/2 |
| Q = 5 | — | — | — | — | 4 | 7/2 | 3 |

TABLE 1-continued $R_{SSL}$ Multipliers: ($\times 1/Cf_{sw}$)

| Levels Available: | 2 | 3 | 4 | 5 | 6 | 7 | 8 |
|---|---|---|---|---|---|---|---|
| Q = 6 | — | — | — | — | — | 5 | 9/2 |
| Q = 7 | — | — | — | — | — | — | 6 |

TABLE 2

$R_{FSL}$ Multipliers: ($\times R_{ds,on}$)

| Levels Available: | 2 | 3 | 4 | 5 | 6 | 7 | 8 |
|---|---|---|---|---|---|---|---|
| Q = 0 | 2 | 4 | 6 | 8 | 10 | 12 | 14 |
| Q = 1 | 2 | 4 | 6 | 8 | 10 | 12 | 14 |
| Q = 2 | — | 8 | 10 | 12.4 | 8.2 | 17.6 | 32.4 |
| Q = 3 | — | — | 26 | 24 | 38 | 48.4 | 50.8 |
| Q = 4 | — | — | — | 64 | 90 | 100 | 100 |
| Q = 5 | — | — | — | — | 130 | 180 | 206 |
| Q = 6 | — | — | — | — | — | 232 | 307 |
| Q = 7 | — | — | — | — | — | — | 378 |

3.4 Switching Loss

Figure 10:
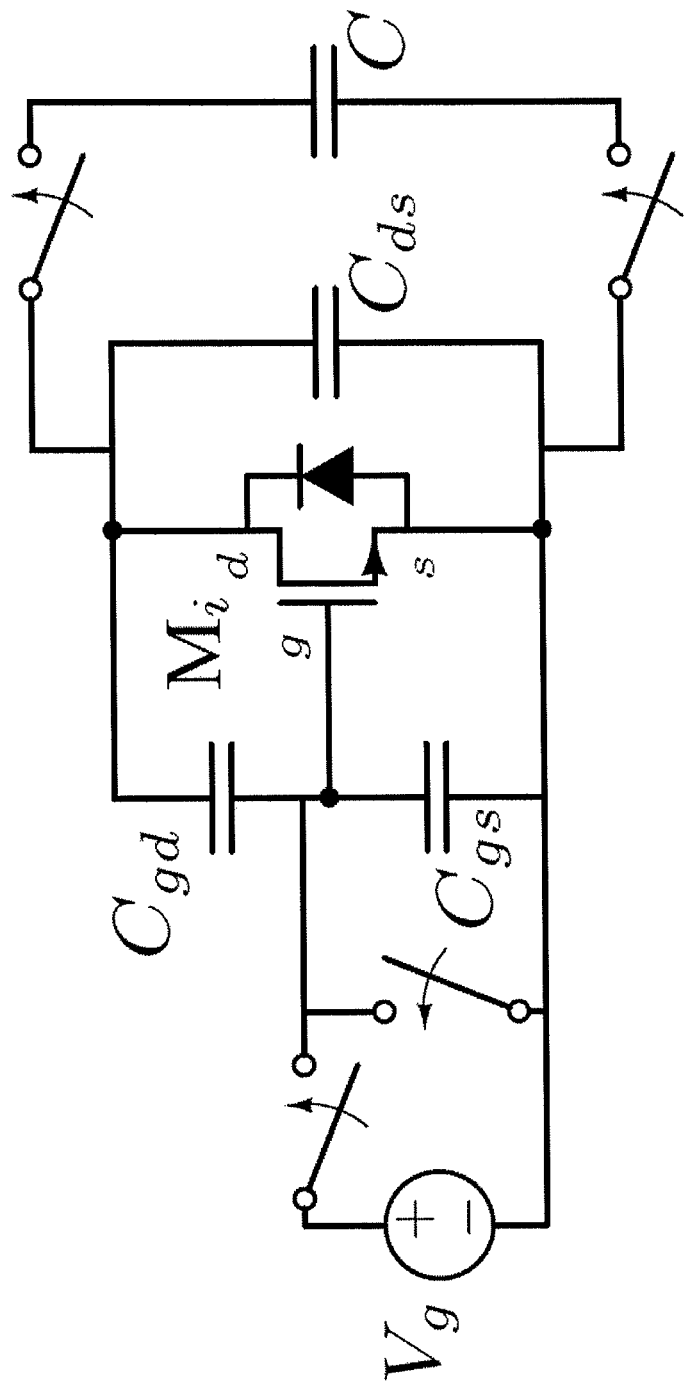
FIG. 10 shows a circuit model which enables a switching loss evaluation in the Marx converter for active MOSFETs.

The linearized model above captures loss due to output current conduction. When evaluating the design in Section 4, it can also be useful to include switching loss, a loss mechanism not explicitly contained in the linearized circuit model of FIG. 1d. The switching loss for any active switch (one that changes state between the two switching phases) can be quantified by considering the circuit shown in FIG. 10, which enables a switching loss evaluation in the Marx converter for active MOSFETs All MOSFETs in the Marx converter reside in at least one loop including only one or two other MOSFETs and a switched capacitor. In the Marx converter, the switched capacitor, C, in FIG. 10 will nominally exhibit a voltage equal to the panel voltage, $V_{in}$, because it is recharged to that potential each cycle. The total switching loss was estimated in terms of typical data sheet values using for N active devices as $$P_{swloss} = N(Q_g V_g + \tfrac{1}{2} Q_{loss} |V_{in}| + Q_{rr} |V_{in}|) f_{sw}. \quad (18)$$

Examining the switching patterns shown in FIG. 8, one can extract the following pattern generalizing the number of active switches according to conversion ratio:

$$N=1, Q=0$$

$$N=3Q-2, Q>0. \quad (19)$$

3.5 Additional Features

The topology of the Marx converter can provide several advantageous features that may add significant value to a solar power system. As mentioned previously, the Marx converter has a natural pass-through feature, which can replicate the function of bypass diodes. When switched into the Q=0 mode in which the conversion ratio is zero, as shown in FIG. 8(b), the output of the Marx converter is connected to panel ground. As a result, the ouptut of the converter is shorted, which allows the converter to appear as a short within the string. Advantageously, by using the Marx converter in the Q=0 mode, the bypass feature can be implemented through control of the Marx converter itself, without the need to add additional switches or bypass diodes separate from the converter.

Another advantage of the Marx converter is the ability to disconnect each module from the load. Such a feature can be beneficial when implementing a safety disconnect feature.

Conventionally, a problem can arise in the case of a fire because the series-connected string of PV modules can create a voltage that is hazardous to firefighters. One conventional technique for preventing hazardous voltages is for the firefighters to cover the PV panels with a dropcloth that prevents light from reaching the panels.

An improved solution to avoid electrocution hazards may be realized using the Marx converter. For example, there may be a need for a disconnect in the event of a fire to prevent electrocution hazards that would otherwise result from the high voltage string output. When a fire occurs, a safety disconnect feature can be implemented by setting the Marx converters for each PV unit into the recharge state illustrated in FIG. 8a, whereby each PV unit is decoupled from the output of its associated Marx converter. By isolating the PV units from the outputs of the MICs, the situation can be prevented whereby relatively low PV unit voltages are combined in series to produce a hazardous voltage. A PV installation can be provided with a conspicuously-located button that can be pressed by a firefighter or other individual to implement the safety disconnect feature. A signal can then be sent to each of the MICs to set the Marx converters into a safety configuration (such as that shown in FIG. 8a). Alternatively, the safety feature may be automatically activated in response to activation of a fire alarm.

Such a disconnect feature may also be particularly beneficial in implementing an anti-islanding mode.

Another advantage is that the run-time local MPPT algorithm described above can be designed to automatically prevent under-voltage conditions at the panel output. In conventional power converters, an under-voltage condition can cause the power converter and/or its associated gate drive circuit to malfunction. Such a condition can be avoided using the techniques described herein. Because the DC-DC modules continuously choose $Q_i$ to closely match $I_{in,i}$ to $I_{mp,i}$, they automatically adjust to over-current conditions, choosing $Q_i=0$ in the limiting case. This feature may be advantageous when the local control circuitry is powered by the panel itself.

3.6 Gate Drive

Figure 11A:
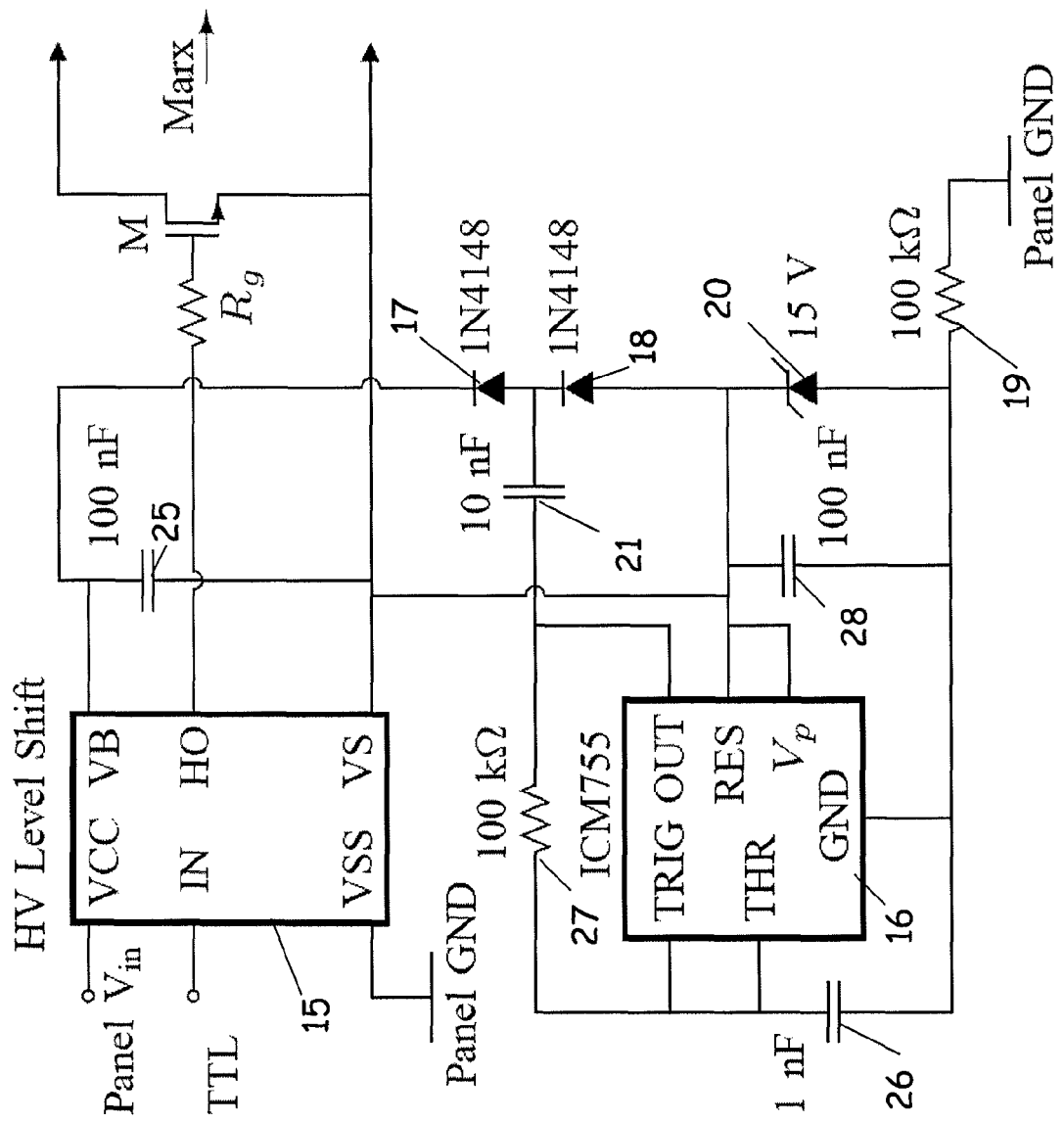
FIG. 11 shows an example of a gate drive circuit for a multilevel output DC-DC switched capacitor converter, according to some embodiments, including a variable resistor for biasing a zener diode.

The gate drive circuit for the Marx converter may operate with a continuous floating gate drive voltage, as the converter itself does not guarantee a periodic charging path to recharge a bootstrap capacitor. An embodiment of a gate drive circuit is shown in FIG. 11a. The transistor of the Marx converter to be driven by the gate drive circuit is shown in FIG. 11a as transistor M.

A level shift circuit 15 can translate ground-referenced logic signals to the gate drive output. The level shift circuit 15 can be implemented as a commercial high side driver IC such as the IR2125. However, the high voltage rating of such a part may be under-utilized for a typical implementation of the system in this work. Therefore, a more cost-effective gate drive may include a custom level shift circuit. However, any suitable level shift circuit may be used. In the embodiment of FIG. 11a, the level shift circuit 15 may receive suitable power and ground signals, such as panel-referenced power and ground signals. A logic signal can be received at the input IN which can be provided by a controller that controls the timing at which the transistor M is to be switched. A bootstrap capacitor 25 can be provided between terminals Vs and VB that is charged to a suitable voltage for driving the gate of transistor M. When the transistor is to be turned on, the terminals VB and HO of the level shift circuit 15 can be connected internally, thereby applying the capacitor voltage to the gate of transistor M via the terminal HO and an optional gate resistor Rg.

In this embodiment, the 555 timer IC 16, diodes 17, 18, and floating capacitor 21 act as a charge pump circuit to generate a suitable voltage for bootstrap capacitor 25. Although a timer 555 circuit IC described in this embodiment, any suitable timer circuit or any suitable oscillator may be used. Capacitor 26 and resistor 27 can have suitable values for setting the timing of the 555 circuit. A zener diode 20 and filter capacitor 28 can provide a voltage source (e.g., at 15 V) connected to the power terminal of the timer circuit 16. When the output OUT of the timer circuit 16 is low, the floating capacitor 21 is charged. In this example, floating capacitor 21 is charged to 15 V. When the output OUT of the timer circuit 16 goes high, the voltage of the low-side terminal of floating capacitor 21 is increased (e.g., to 15 V), which causes the voltage of the high-side terminal of the floating capacitor 21 to be increased by the same amount (e.g., to 30 V). The 30 V signal is then transferred to the bootstrap capacitor 25 via diode 17. When terminal VS is at 15 V, the charge pump circuit thereby can charge the bootstrap capacitor 25 to 15 V referenced to VS. In this example, the charge pump drives the VB node to twice its supply voltage referenced to its own floating GND leading to a 15 V floating drive referenced to the MOSFET source. This voltage can be adjusted by choosing the voltage of the Zener diode.

The resistor 19 between the 555 timer GND terminal and Panel GND terminal and the zener diode 20 allows the ground pin of timer IC 16 to float 15 V below the source of the driven MOSFET M. The low power version of the 555 timer IC (ICM755) can be used in this circuit to achieve low power dissipation in the part itself and to achieve sufficient quiescent current despite the resistor 19 to ground. The resistance of resistor 19 can be selected based on which transistor of the converter is being driven (and its corresponding source voltage) and/or based on the conversion ratio being implemented by the power converter. In some embodiments, resistor 19 can be implemented as a variable resistor. Implementing resistor 19 as a variable resistor can enable setting the current through the zener diode 20. The current through the zener diode 20 can be chosen to be just high enough so that the zener diode is appropriately biased. Higher current through the zener diode may result in unneeded loss and therefore reduced efficiency. The resistance of resistor 19 can be selected to set the current through the zener diode 20 in view of these considerations. When the source voltage of the transistor M varies over time, the time average source voltage may be used when determining a suitable resistance value. Any suitable type of variable resistor may be used.

Figure 11B:
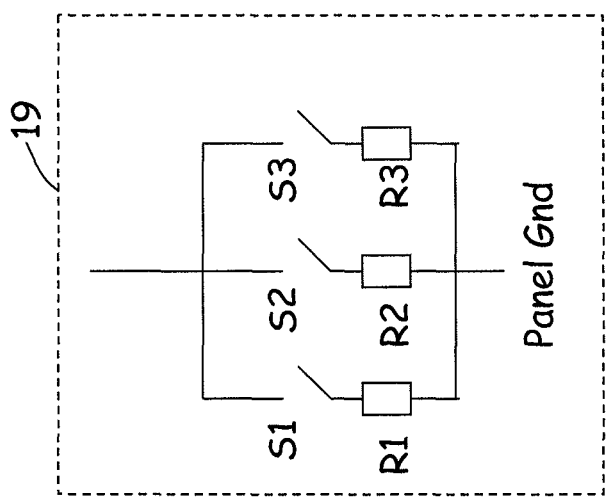

FIG. 11b shows an example of a variable resistor 19, according to some embodiments. As shown in FIG. 11b, variable resistor 19 includes several resistors R of different resistances connected in parallel, with each resistor being in series with a switch S. One or more switches S can be turned on to select a suitable resistance value. If the switch is connected with its source to ground and drain to the resistor and it is an N-type gransistor, in may be controlled with a ground-referenced signal directly, e.g, from the ouptut pin of a microcontroller already included in the controller 6.

In some embodiments, a gate drive circuit for a Marx converter can include several of the circuits of FIG. 11 for each high-side transistor having a source that is not referenced to ground. Different gate drive voltages can be generated for different transistors of the Marx converter, as needed.

4 Design Example

A 3-panel 510 W system was designed and simulated in SPICE and in MATLAB. Among the key topological considerations for implementing a practical Marx DC-DC MIC is the option of using a power diode in series with the output of each module. Such a diode can be used to block current from conducting backwards through the body diode of the upper MOSFET in the output stage during $\phi_1$. In order to alleviate any need to synchronize switching action among modules, a local output non-electrolytic capacitor can be placed across each MIC to create a local DC bus.

4.1 Number of Levels

Figure 12:
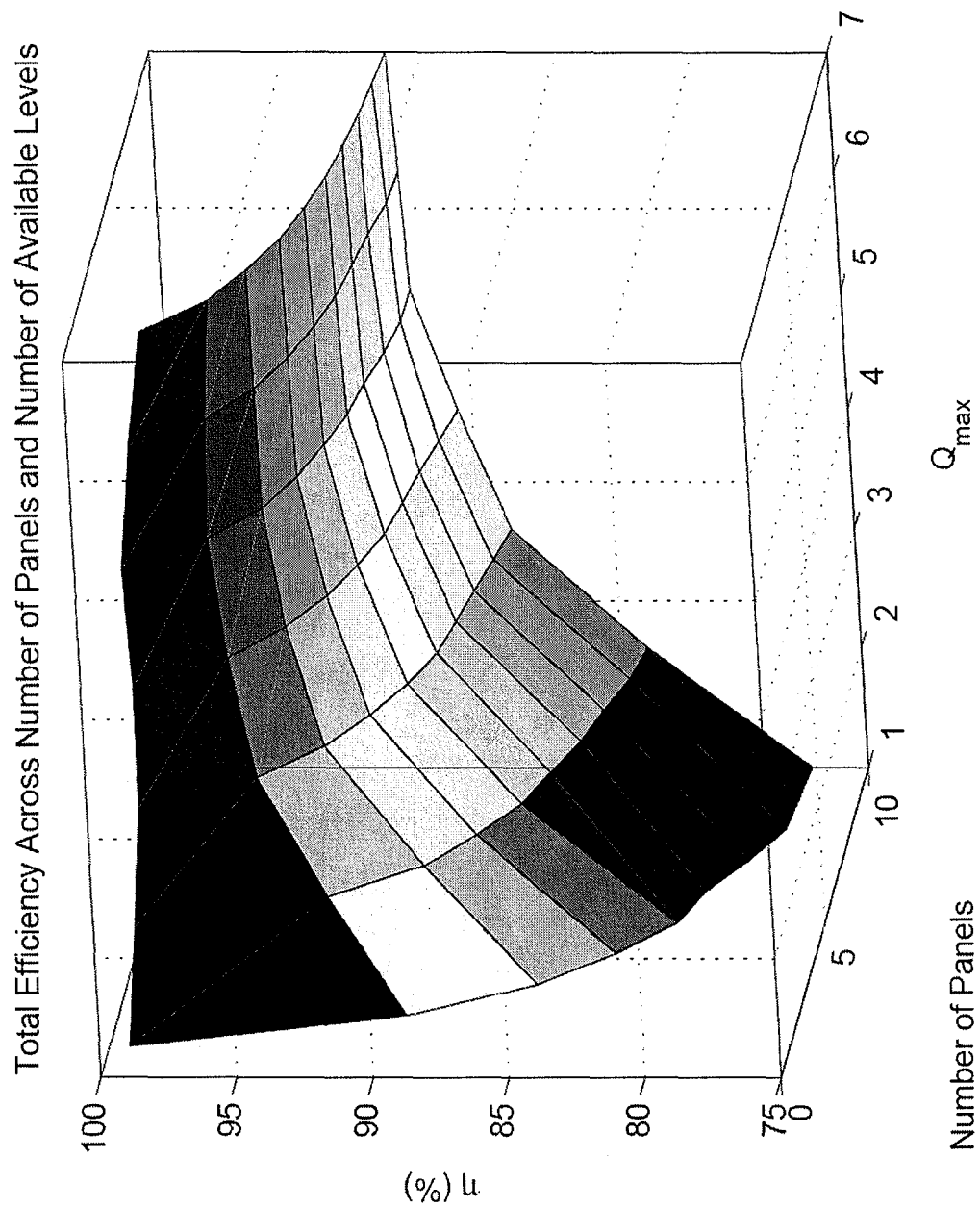
FIG. 12 shows the predicted performance versus the number of panels used and the maximum conversion ratio used for the DC-DC power converter.

The number of conversion levels of the multilevel converter was chosen using the same Monte Carlo prediction methods described in Section 2.4. Having enumerated loss mechanisms, total efficiency was used to determine performance. To choose an appropriate number of conversion levels, an unoptimized but lossy system was simulated using nominal circuit parameters and MOSFET device characteristics. The predicted performance is plotted in FIG. 12 for a system with the following parameters: $Q_{avail}=[0:1:Q_{max}]$, Monte Carlo Length=400, $I_{o,sweep}=[0.01:0.02:6.93]$ A, C=12.5 µF, $f_{sw}$=250 kHz, $R_{dson}$=10 mΩ, $Q_g$=10 nC, $Q_{oss}$=5 nC, $Q_{rr}$=25 nC, $V_g$=15 V, $V_{oc}$=29 V, $V_{mp}$=24.6 V, $I_{sc}$=7.38 A, $I_{mp}$=6.93 A, Distribution Compression=50. The data show diminishing returns in total efficiency beyond 5 levels. Therefore a 5-level Marx converter may be chosen for the MIC. However, a converter with any suitable number of levels may be chosen depending on the application.

4.2 MOSFET Choice and Switching Frequency Optimization

Figure 13:
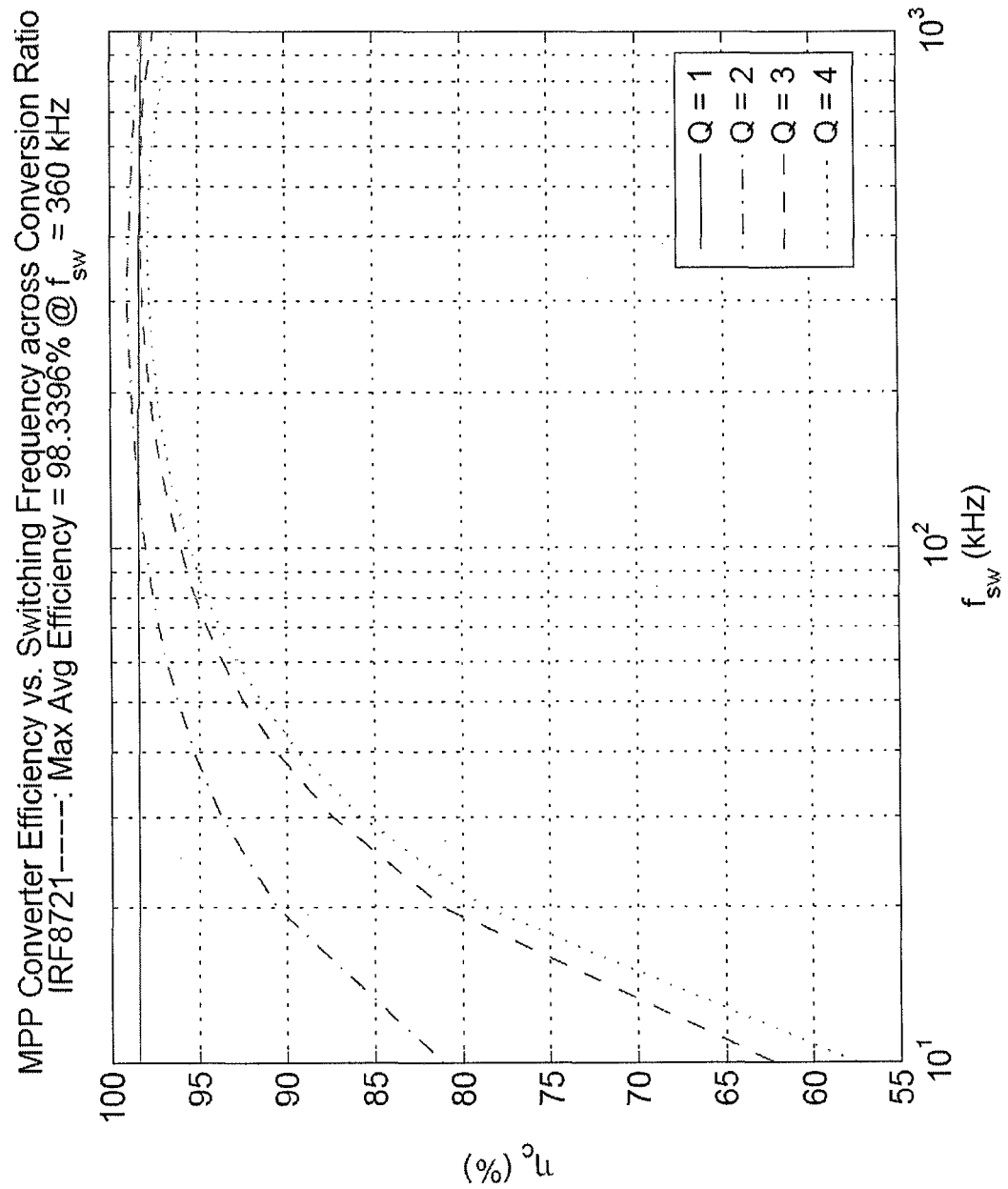
FIG. 13 shows a plot of converter efficiency versus switching frequency for various conversion ratios.

Having chosen a suitable value for the non-electrolytic (e.g., metal film) switched capacitors in the 5-level Marx converter, the choice of MOSFET and switching frequency can be optimized together. All MOSFETs in the Marx converter may reside in loops containing a switched capacitor and other MOSFETs only. MOSFET drain-source voltages can therefore be upper bound by the maximum panel voltage. Accordingly, it can be advantageous to choose a panel whose open-circuit voltage is just below a standard value for $V_{dss}$. Over-sizing the MOSFET beyond the required $V_{ds}$ rating may lead to unneeded switching or conduction loss and a suboptimal design. A number of likely MOSFETs can be identified having $V_{dss}$=30 V for the panel open-circuit voltage of 29 V. Suitable MOSFETs can be chosen based on their on-resistance, $R_{ds,on}$, and gate capacitance, $C_g$. With the losses derived in (17) and (18), the performance was plotted for each MOSFET across switching frequency and conversion ratios. FIG. 13 shows such a plot for the selected MOSFET (IRF8721, C=12.5 µF, $V_{mp}$=24.6 V, $I_{mp}$=6.93 A, MP=170 W, $V_g$=10 V). A maximum average converter efficiency (across all conversion ratios) of >98% was predicted at a switching frequency of 360 kHz. Note that the gate drive voltage was decreased from 15 V in the unoptimized system to 10 V in the optimized system. Adjusting the gate drive voltage trades off conduction loss (on-resistance) for switching loss.

Any suitable switching frequency may be used in the DC-DC power converter. In some embodiments, a switching frequency of between 10 kHz and 500 kHz, inclusive, may be chosen, based on the considerations discussed herein, such as minimizing losses.

4.3 Power Diode

The power diode 8 can be chosen to support the peak output current and to block the peak reverse voltage safely. Secondly, it can be chosen for low capacitance, forward voltage, and ESR. Having added output diodes to the implemented system, the additional losses can be estimated as follows:

$$V_{fwd,i} = \ln\left(\frac{I_o}{I_s+1}\right)n\frac{kT}{q} + ESR_{diode}I_o \quad (20)$$

$$P_{diode} = I_o \sum_i V_{fwd,i} + f_{sw}C_{j,i}V_{rr,i}^2, \quad (21)$$

where $V_{rr}$ is the reverse voltage during $\phi_1$ and $C_j$ is the junction capacitance of the diode. This expression can be used to improve the accuracy of the Monte Carlo performance predictions. An example of a suitable power diode is Motorola MBR20100C Shottky diode. However, any suitable power diode can be used.

4.4 Simulated Prototype

The optimized system was simulated using SPICE and MATLAB. The performance of this system was predicted with Monte Carlo methods having incorporated the losses derived in (17), (18) and (21). The results are shown in Table 3 for the following parameters: 5-level converter, 3 Panel optimized system: Monte Carlo Length=100, Distribution Compression=50%, $\Delta I_o$=1 mA, Diode Loss=[on].

TABLE 3

Simulated statistical performance:

| efficiency | symbol | simulated result |
|---|---|---|
| tracking | $\eta_p$ | 95.43% |
| conversion | $\eta_c$ | 97.56% |
| total | $\eta$ | 93.10% |

A summary of circuit elements selected for the simulated prototype is shown in Table 4.

TABLE 4

Circuit component summary

| Component | Part No./Value | Note |
|---|---|---|
| Switched Capacitors, | 12.5 µF | Metal Film |
| Output Capacitor | | 1P4.7P6.8 µF |
| Panel Capacitor | 25 µF | 12.5P12.5 µF |
| MOSFET | IRF8721 | |
| Output Diode | MBR20100C | |

The central inverter may not track panel power, corresponding to $\eta_p$, directly. Instead it tracks its input power, corresponding to $\eta$. Having incorporated the loss mechanisms from Section 3 and in equation (21), this observation was accounted for in simulation by allowing the inverter to choose the $I_o$ that maximized its input power. Tracking efficiency was recorded for comparison to total efficiency.

Figure 14:
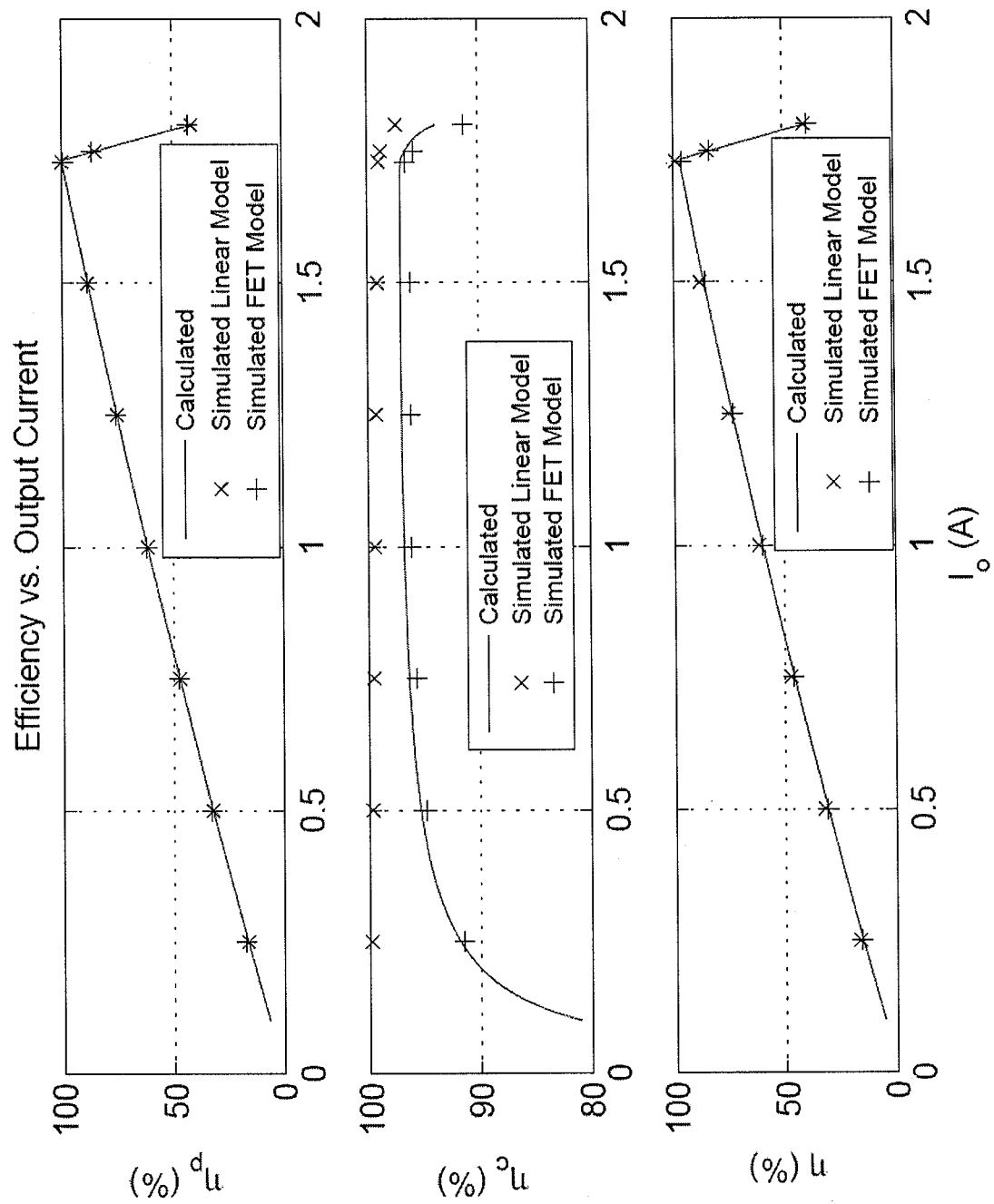
FIG. 14 shows plots of efficiency versus output current.

An experiment was performed in simulation to validate the linear modeling effort and loss calculations above. A fixed set of conversion ratios and MPPs was chosen for the three panels. Tracking, conversion, and total efficiencies were plotted for a single $I_o$ sweep. FIG. 14 compares the results for calculated data based on Section 3 and equation (21), a SPICE simulation of the linearized model and a SPICE simulation of the MOSFET system. The difference in $\eta_c$ between the linearized model and the other two data sets represents switching and output diode loss. Errors between the calculated model and FET simulation are likely due to estimation errors in computing diode and switching losses. Note that in the plots of FIG. 14, the maximum in total efficiency lines up closely with the maximum in tracking efficiency. The parameters associated with the plots of FIG. 14 were a Single $I_o$ sweep, 3 sources, Q=[0, 2, 4], $I_{mp,vec}$=[0.007 3.465 6.93] A, C=12.5 µF, $f_{sw}$=360 kHz, MOSFET: IRF8721, $V_g$=10 V, deadtime=100 ns, $R_g$=4 Ω.

Figure 15A:
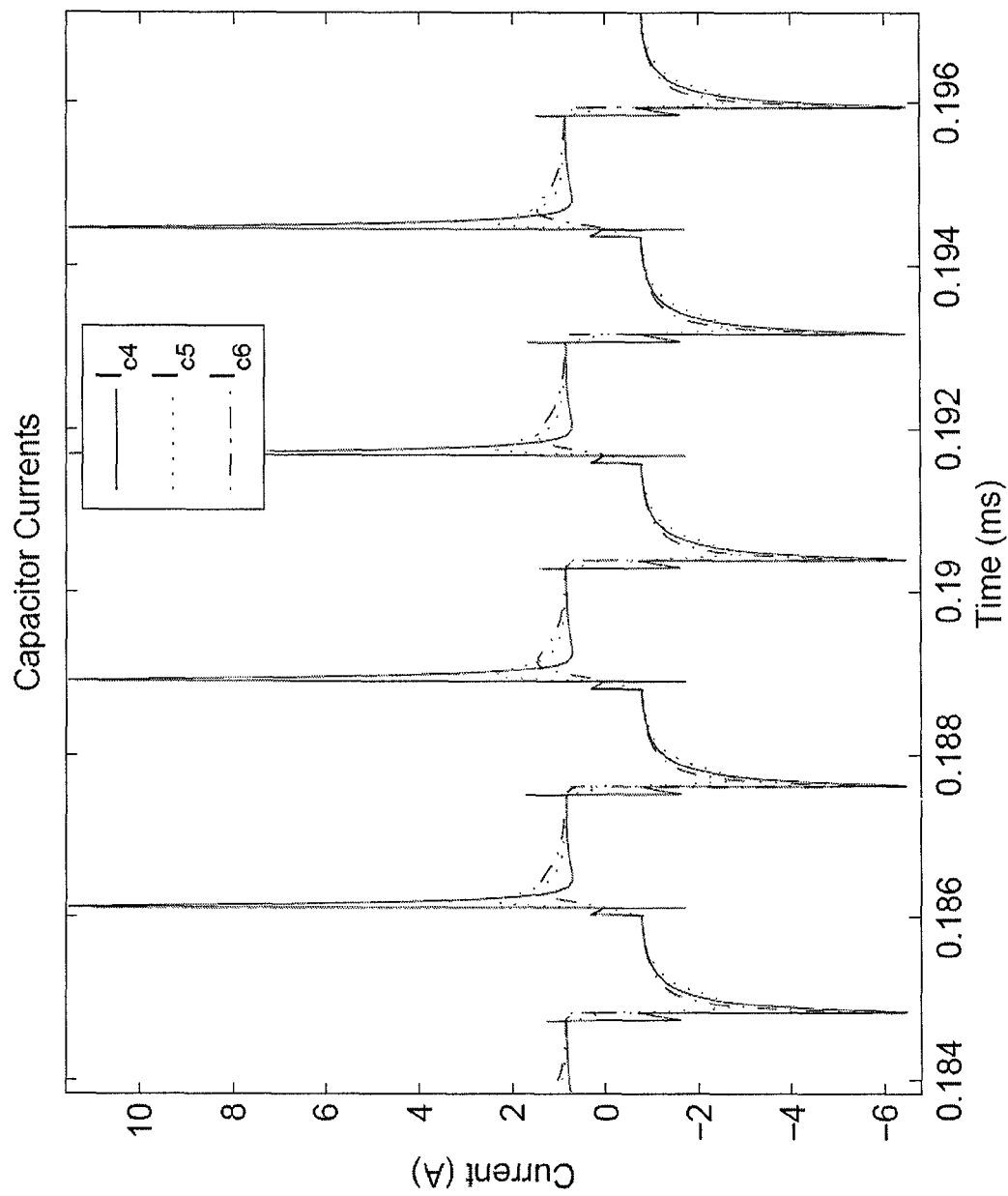
FIG. 15 shows simulated time domain waveforms for the capacitor currents and system currents in the Marx converter.
Figure 15B:
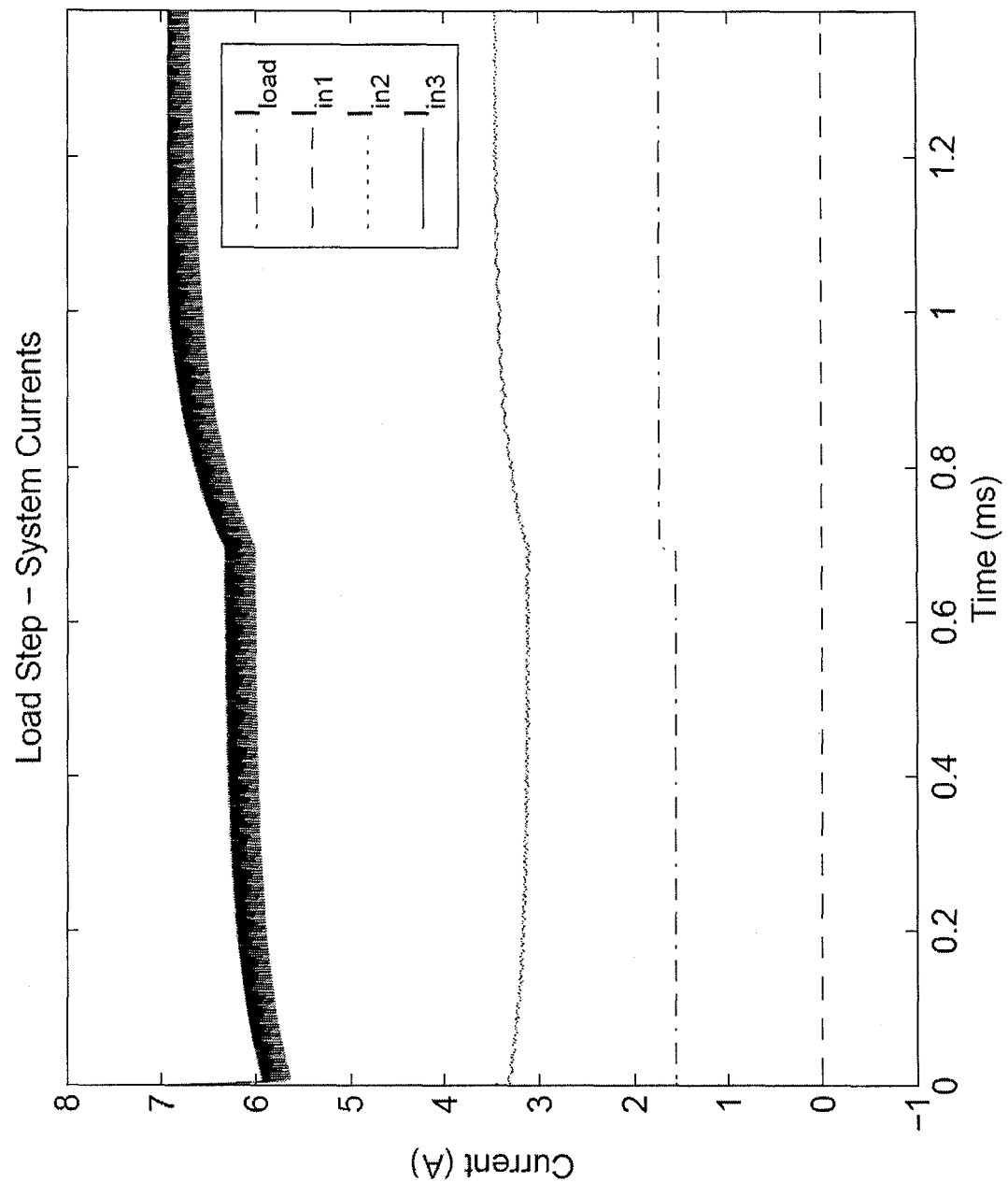

Time domain waveforms from the simulated system are shown in FIG. 15. FIG. 14 shows a zoom-in of the capacitor currents. The shape of those currents indicates operation between the slow and fast switching limits defined in Section 3.3. This result is a natural outcome of the MOSFET choice and switching frequency optimization step above.

FIG. 14 shows panel input currents during a step change in the load current from 90% to 100% of the predicted maximum power current. In this example, Panel 1 is bypassed ($Q_1$=0) because its MPP is quite low; $I_{in1}$=0 in the plots. The other two panels initially settle close to their respective $I_{mp,i}$'s-Panel 2 exhibits half of the photovoltaic current that Panel 3 does. When the load current steps to its maximum power value, $I_{in2}$ and $I_{in3}$ settle on their respective $I_{mp,i}$'s.

4.5 DC AC Dynamics

Figure 16:
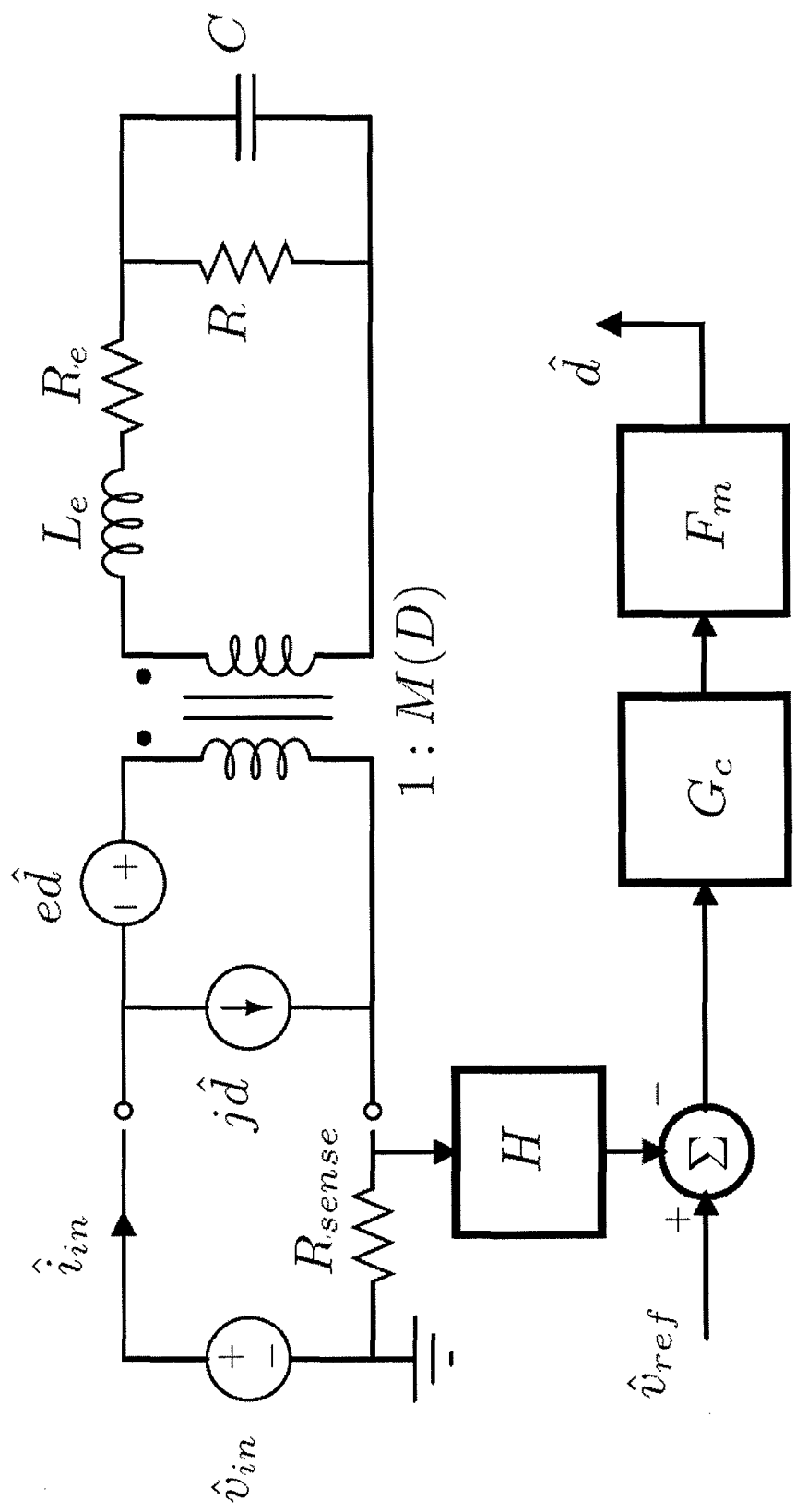
FIG. 16 shows a linearized model of the central input current-controlled inverter.

A linearized model of the central input current-controlled inverter is shown in FIG. 16. The closed-loop transfer functions of particular interest can be derived from that circuit. They are $$\frac{\hat{i}_{in}}{\hat{v}_{in}}(s) = \frac{M^2(D)}{sL_e + R_e + RP\frac{1}{sC}}\left(\frac{1}{1+T(s)}\right) \quad (22)$$

$$\frac{\hat{i}_{in}}{\hat{v}_{ref}}(s) = \frac{A(s)}{1+A(s)F(s)}, \quad (23)$$

where $$A(s) = G_c(s)F_m\left(j(s) + e(s)\frac{M^2(D)}{sL_e + R_e + RP\frac{1}{sC}}\right) \quad (24)$$

$$F(s) = HR_{sense} \quad (25)$$

$$T(s) = AF. \quad (26)$$

Figure 17:
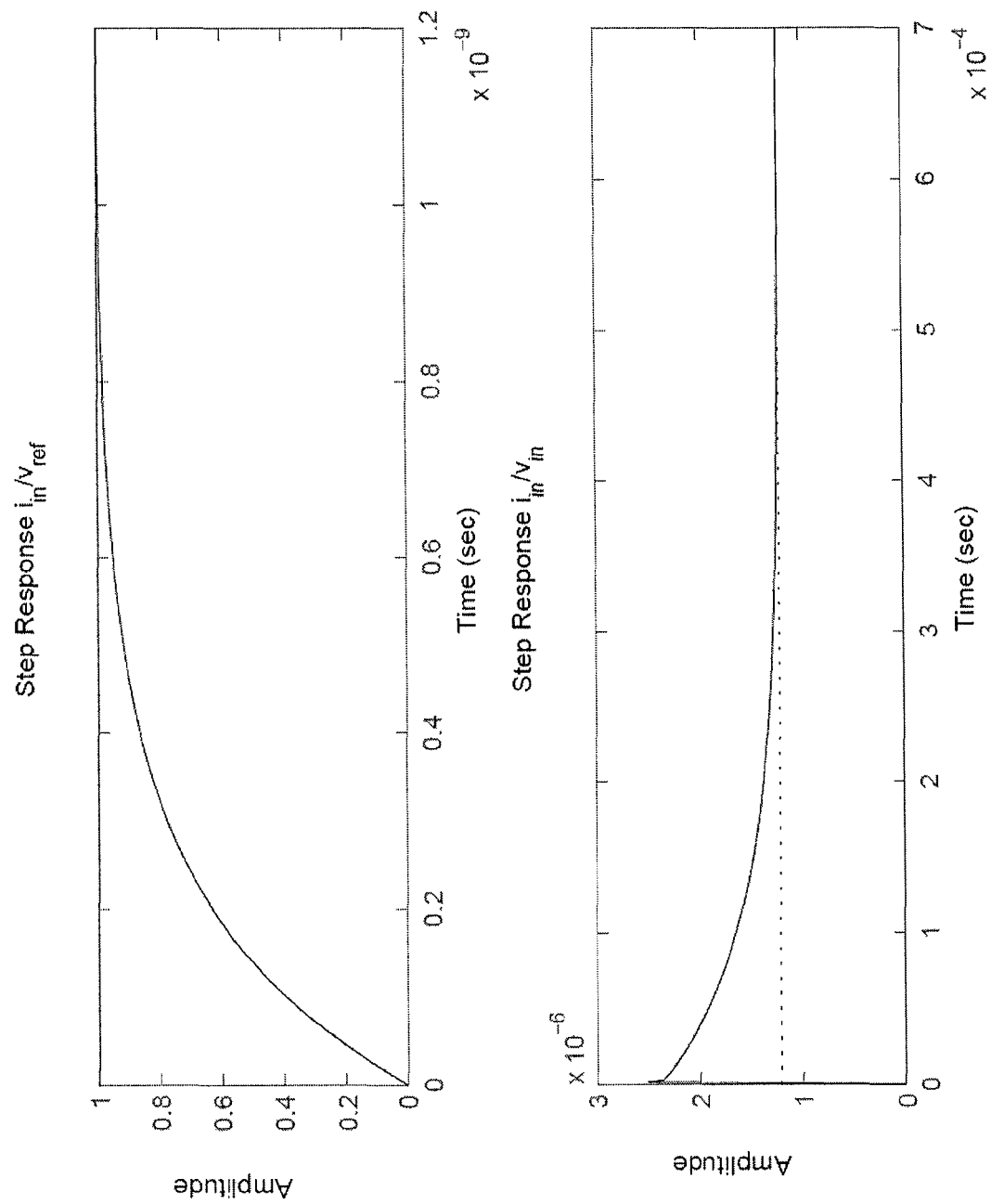
FIG. 17 shows step responses of the closed-loop transfer functions in equations (22) and (23) used in the linearized model.

The linear model parameters, e, j, M(D), $L_e$, and $R_e$ were chosen for a 500 W buck-derived inverter topology. FIG. 17 shows step responses of the closed-loop transfer functions in (22) and (23). They show relatively fast settling times in the input current upon step transients in the input voltage (corresponding to the string DC bus voltage) and the reference voltage (corresponding to the control for the sweepable input current). The lower plot also indicates a significant attenuation of the input current response to changes in the input voltage. This attenuation is largely dependent on the low-frequency magnitude of the loop gain T(s) as indicated by equation (22).

5 Conclusions

Widespread grid penetration of PV relies on the reduction of capital cost and total cost of ownership for solar power systems. These factors should guide the design of photovoltaic power circuits and system architectures. Described herein is a full system approach utilizing switched capacitor multilevel DC-DC converters. Substantial cost reductions may be possible by providing per panel MPPT without the need for per panel magnetics. Coupling the DC-DC modules with a ripple port inverter can eliminate the need for electrolytic capacitors, enabling long-life operation. There are tradeoffs among switching frequency, converter efficiency, and global tracking efficiency ($I_o$ step size) when considering the dynamics and runtime MPPT approaches for the full system.

Decoupling of the MPPT control among MICs can provide a significant advantage for these systems so that the MICs can track the power output of their individual panels despite the actions of the other MICs. Conventional MICs use magnetics-based conversion techniques with complicated control circuits that allow them to appear to the string as a current source on the MIC level. By doing so the MIC's can decouple their MPPT control from the actions of other MICs.

By contrast, the techniques described herein do not require magnetic components. In the absence of magnetic components, the converter may not appear as a current source to the string, and complicated control circuit may not be able to remedy this problem. However, by using the system level approach described herein, the MICs can be decoupled from one another even without having the ability to control the MICs to act as a current source to the string. In the system level approach described herein, the central inverter can be input-current-controlled and it can appear as a current sink to all of the MICs. When no magnetic components are used in the MICs, using an input-current controlled central inverter can restore the ability of the MICs to decouple their MPPT control, without the need for the MICs to act as current sources themselves.

Using a central inverter that is input-current-controlled enable decoupling on the MIC level and therefore good tracking efficiency despite the fundamental limitations of the tracking ability of a multilevel output DC-DC switched capacitor converter. Applying this technique to the central inverter can enable good tracking efficiency without per panel magnetics, as shown above.

This system level approach can enable efficient use of the multilevel output DC-DC switched capacitor converter, but use of a multilevel output DC-DC switched capacitor converter is not required. That is, the same system level approach that could be used with magnetics-based MIC, which may simpliy the control of the MICs.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

For example, embodiments of controllers performing maximum power point tracking, such as controllers 6 and 7, may be implemented using hardware, software or a combination thereof. When implemented in software, the software code can be executed on any suitable hardware processor or collection of hardware processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed to perform the functions recited above.

Also, a computer may have one or more input and output devices. Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The terms "connected" and "coupled" are used interchangeably herein.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A circuit for controlling a photovoltaic system, the circuit comprising:
 a plurality of series-connected module integrated converters including at least a first module integrated converter and a second module integrated converter, the first module integrated converter comprising:
  a first multi-level output DC-DC switched capacitor power converter configured to control a first photovoltaic module; and
  a first controller configured to control the first multi-level output DC-DC switched capacitor power converter to track a maximum power point of the first photovoltaic module, wherein the second module integrated converter comprises:
 a second multi-level output DC-DC switched capacitor power converter configured to control a second photovoltaic module; and
 a second controller configured to control the second multi-level output DC-DC switched capacitor power converter to track a maximum power point of the second photovoltaic module,
 wherein the photovoltaic system further comprises:
 an inverter coupled to the plurality of series-connected module integrated converters, the inverter comprising a third controller configured to control a current through the plurality of series-connected module integrated converters.

2. The circuit of claim 1, wherein the first multi-level output DC-DC switched capacitor power converter is configured to convert a first signal from the first photovoltaic module into a second signal, wherein a ratio between the first signal and the second signal is a selected conversion ratio of a set of discrete conversion ratios of the multi-level output DC-DC power converter.

3. The circuit of claim 2, wherein the set of discrete conversion includes no more than five conversion ratios.

4. The circuit of claim 1, wherein the first multi-level output DC-DC switched capacitor power converter comprises a Marx converter.

5. The circuit of claim 1, wherein the inverter comprises a ripple port inverter.

6. The circuit of claim 1, wherein the third controller is configured to control the current through the plurality of series-connected module integrated converters to be constant.

7. The circuit of claim 1, wherein the first controller is configured to change an operating point of the first photovoltaic module at a first rate and the third controller is configured to change the current at a second rate that is slower than the first rate.

8. A system for controlling a plurality of photovoltaic units, the system comprising:
 a first power converter;
 a first controller configured to control the first power converter to operate a first photovoltaic unit to track a maximum power point of the first photovoltaic unit;
 a second power converter in series with the first power converter;
 a second controller configured to control the second power converter to operate a second photovoltaic unit to track a maximum power point of the second photovoltaic unit; and
 a third controller configured to control a current through the first and second power converters,
 wherein the first power converter comprises a first multi-level output DC-DC switched capacitor power converter and the second power converter comprises a second multi-level output DC-DC switched capacitor power converter.

9. The system of claim 8, wherein the first power converter does not include an inductor or a transformer.

10. The system of claim 8, wherein the first multi-level output DC-DC switched capacitor power converter comprises a Marx converter.

11. The system of claim 8, wherein the third controller controls an inverter to establish the current.

12. The system of claim 8, wherein the inverter comprises a ripple port inverter.

13. The system of claim 8, wherein the third controller is configured to control the current to be constant.

14. The system of claim 8, wherein the first photovoltaic unit is a first photovoltaic module and the second photovoltaic unit is a second photovoltaic module.

15. The system of claim 8, further comprising:
 a gate drive circuit, comprising:
  a level shift circuit; and
  a charge pump circuit that provides a floating gate drive voltage to a transistor of the first multi-level output DC-DC switched capacitor power converter based on a signal from the level shift circuit.

16. The system of claim 15, wherein the charge pump circuit comprises an oscillator circuit and the gate drive circuit further comprises:
 a zener diode connected between a power terminal of the timer circuit and a source terminal of the transistor.

17. The system of claim 16, further comprising a resistive element coupled between the power terminal of the timer circuit and a terminal that is configured to be grounded.

18. The system of claim 17, wherein the resistive element has a variable resistance.

19. The system of claim 17, wherein the resistive element comprises a plurality of resistive elements and switches, and wherein the switches are referenced to ground.

* * * * *